(12) United States Patent
Yu et al.

(10) Patent No.: US 12,193,209 B2
(45) Date of Patent: Jan. 7, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Yexiao Yu, Hefei (CN); Zhongming Liu, Hefei (CN); Jia Fang, Hefei (CN); Longyang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 588 days.

(21) Appl. No.: 17/470,863

(22) Filed: Sep. 9, 2021

(65) Prior Publication Data

US 2022/0285361 A1    Sep. 8, 2022

Related U.S. Application Data

(63) Continuation of application No. PCT/CN2021/105153, filed on Jul. 8, 2021.

(30) Foreign Application Priority Data

Mar. 5, 2021  (CN) .......................... 202110246880.0

(51) Int. Cl.
*H01B 12/00* (2006.01)
*H10B 12/00* (2023.01)

(52) U.S. Cl.
CPC ....... *H10B 12/0335* (2023.02); *H10B 12/315* (2023.02); *H10B 12/482* (2023.02); *H10B 12/485* (2023.02)

(58) Field of Classification Search
CPC ............. H10B 12/0335; H10B 12/315; H10B 12/482; H10B 12/485; H10B 12/37
(Continued)

(56) References Cited

U.S. PATENT DOCUMENTS

| 11,049,863 B2 | 6/2021 | Feng et al. |
| 2008/0121960 A1 | 5/2008 | Ohuchi |

(Continued)

FOREIGN PATENT DOCUMENTS

| CN | 107492550 B | 7/2018 |
| CN | 108831884 A | 11/2018 |

(Continued)

OTHER PUBLICATIONS

First Office Action of the Chinese application No. 202110246880.0, issued on May 27, 2022, 13 pgs.

(Continued)

*Primary Examiner* — Ori Nadav
(74) *Attorney, Agent, or Firm* — Kilpatrick Townsend & Stockton LLP

(57) ABSTRACT

A semiconductor structure and a manufacturing method thereof are provided. The method includes following operations. A substrate including active regions and isolation regions is provided. First trench structures are formed on the substrate, the first trench structure passing through the active region and the isolation region. Bit line contact structures are formed in the first trench structures. Bit line structures are formed on the bit line contact structures, at least part of the bit line structure being positioned in the first trench structure. Bit line protection structures are formed on the bit line structures, the bit line protection structure at least covering an upper surface of the bit line structure. Capacitor contact assemblies are formed, the capacitor contact assembly including a first capacitor contact structure and a second capacitor contact structure which covers an upper surface and part of a side wall of the first capacitor contact structure.

11 Claims, 23 Drawing Sheets

(58) Field of Classification Search
USPC ........................................................ 257/629
See application file for complete search history.

(56) References Cited

U.S. PATENT DOCUMENTS

| | | | | |
|---|---|---|---|---|
| 2013/0214338 A1* | 8/2013 | Mikasa | ............... | H01L 27/0629 257/296 |
| 2015/0371891 A1 | 12/2015 | Lee et al. | | |
| 2016/0181198 A1* | 6/2016 | Kim | ........................ | H10B 12/50 257/532 |
| 2017/0213837 A1* | 7/2017 | Wang | ...................... | H10B 43/27 |
| 2018/0247943 A1 | 8/2018 | Feng et al. | | |

FOREIGN PATENT DOCUMENTS

| | | |
|---|---|---|
| CN | 208655646 U | 3/2019 |
| CN | 209216973 U | 8/2019 |
| CN | 110880509 A | 3/2020 |
| CN | 110890365 A | 3/2020 |
| CN | 110890368 A | 3/2020 |
| CN | 111799261 A | 10/2020 |
| CN | 112864153 A | 5/2021 |
| CN | 113035872 A | 6/2021 |
| KR | 20020058341 A | 7/2002 |
| KR | 100363702 B1 | 12/2002 |

OTHER PUBLICATIONS

European Patent Office, Extended European Search Report Issued in Application No. 21928731.5, Jul. 26, 2024 Germany, 10 pages.

* cited by examiner though those embodiments are described in a general expression in the text that are commonly understood by those of ordinary skill in the art to which the present disclosure belongs. The terms used herein in the specification of the present disclosure are for the purpose of describing specific embodiments only and are not intended to limit the present disclosure.

SEMICONDUCTOR STRUCTURE AND MANUFACTURING METHOD THEREOF

CROSS-REFERENCE TO RELATED APPLICATIONS

This is a continuation application of International Patent Application No. PCT/CN2021/105153, filed on Jul. 8, 2021, which claims priority to Chinese Patent Application 202110246880.0, filed on Mar. 5, 2021 and entitled "SEMICONDUCTOR STRUCTURE AND MANUFACTURING METHOD THEREOF". The disclosures of International Patent Application No. PCT/CN2021/105153 and Chinese Patent Application 202110246880.0 are incorporated by reference herein in their entireties.

BACKGROUND

With the development of a semiconductor technology, memory devices are increasingly pursuing high speed, high integration density, low power consumption and the like. With the micro shrinkage of a dimension of the semiconductor structure, the structure stability of a bit line directly determines whether a Dynamic Random Access Memory (DRAM), in particular a DRAM with a key dimension smaller than 20 nm, is excellent in electrical properties.

In addition, in a semiconductor manufacturing process, with the shrinking of key dimensions, the resistance problem is an urgent problem to be solved.

SUMMARY

The present disclosure relates to the technical field of semiconductors, and in particular to a semiconductor structure and a manufacturing method thereof.

According to a first aspect of the present disclosure, there is provided a manufacturing method of a semiconductor structure including the following operations.

A substrate is provided, the substrate including active regions and isolation regions.

First trench structures are formed on the substrate, the first trench structure passing through the active region and the isolation region.

Bit line contact structures are formed in the first trench structures, an upper surface of the bit line contact structure being lower than an upper surface of the substrate.

Bit line structures are formed on the bit line contact structures, the first trench structure being filled up with the bit line contact structure and the bit line structure, and at least part of the bit structure being positioned in the first trench structure.

Bit line protection structures are formed on the bit line structures, the bit line protection structure at least covering an upper surface of the bit line structure, and a second trench structure being provided between adjacent bit line protection structures.

Capacitor contact assemblies are formed, the capacitor contact assembly including: a first capacitor contact structure positioned in the second trench structure; and a second capacitor contact structure covering an upper surface and part of a side wall of the first capacitor contact structure.

According to a second aspect of the present disclosure, there is provided a semiconductor structure including a substrate, first trench structures, bit line contact structures, bit line structures, bit line protection structures and capacitor contact assemblies.

The substrate includes active regions and isolation regions.

The first trench structures are positioned in the substrate and each pass through the active region and the isolation region.

The bit line contact structures are positioned in the first trench structures, and an upper surface of the bit line contact structure is lower than an upper surface of the substrate.

The bit line structures are positioned on the bit line contact structures. At least part of the bit line structure is positioned in the first trench structure, and the first trench structure is filled up with the bit line contact structure and the bit line structure.

The bit line protection structures are positioned on the bit line structures. The bit line protection structure at least covers a surface of the bit line structure, and a second trench structure is provided between adjacent bit line protection structures.

The capacitor contact assembly includes a first capacitor contact structure positioned in the second trench structure and a second capacitor contact structure covering an upper surface and part of a side wall of the first capacitor contact structure.

BRIEF DESCRIPTION OF THE DRAWINGS

In order to describe the technical solutions in the embodiments of the present disclosure or the conventional art more clearly, the drawings needed to be used in the description of the embodiments or the conventional art will be simply introduced below. Apparently, the drawings in the following description are only some embodiments of the present disclosure. Those of ordinary skill in the art may further obtain other drawings according to these drawings without creative work.

DETAILED DESCRIPTION

Figure 1:
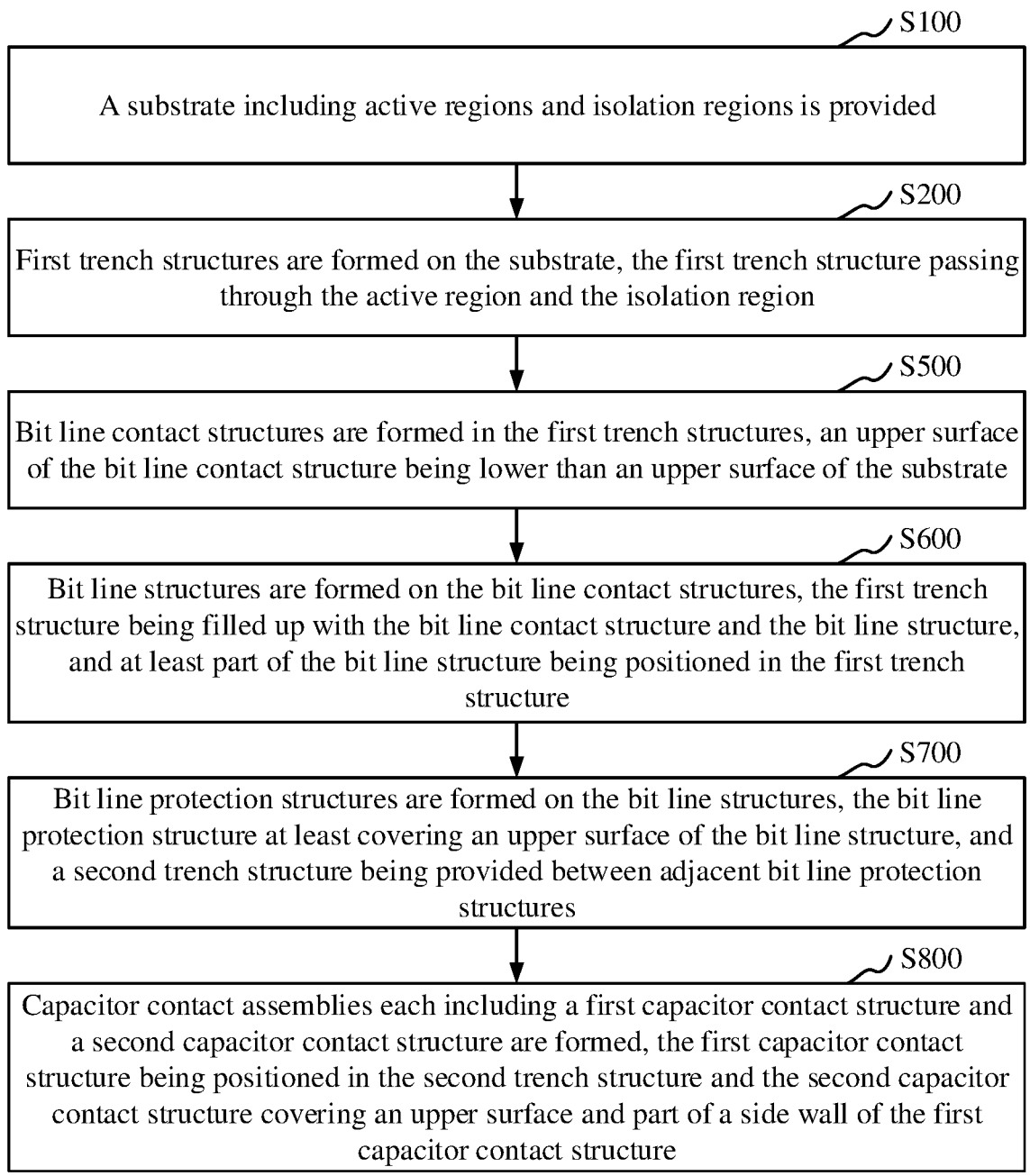
FIG. 1 is a flowchart showing a manufacturing method of a semiconductor structure provided in an embodiment.

To facilitate an understanding of the present disclosure, the present disclosure will be described more fully below in detail with reference to the accompanying drawings. Preferred embodiments of the present disclosure are given in the accompanying drawings. However, the present disclosure may be embodied in many different forms and should not be limited to the embodiments set forth herein. Rather, these embodiments are provided so that the present disclosure will be more thorough and comprehensive.

Unless defined otherwise, all technical and scientific terms used herein have the same meaning as commonly understood by those of ordinary skill in the art to which the present disclosure belongs. The terms used herein in the specification of the present disclosure are for the purpose of describing specific embodiments only and are not intended to limit the present disclosure.

It is to be understood that when an element or a layer is referred to as being "on", "adjacent to", "connected to", or "coupled to", to other elements or layers, it may be directly on, adjacent to, connected to, or coupled to the other elements or layers, or there may be an intervening element or layer. Rather, when an element is referred to as being "directly on", "directly adjacent to", "directly connected to", or "directly coupled to" other elements or layers, there is no an intervening element or layer. It is to be understood that although the terms of first, second, third, and the like may be used to describe various elements, components, regions, layers, doping types, and/or parts, these elements, components, regions, layers, doping types, and/or parts should not be limited by these terms. These terms are only used to distinguish one element, component, region, layer, doping type, or part from another element, component, region, layer, doping type, or part. Therefore, without departing from the teachings of the disclosure, the first element, component, region, layer, doping type or part discussed below can be expressed as a second element, component, region, layer or part.

Spatial relation terms such as "under", "underneath", "lower", "below", "above", "upper", and the like, may be used herein to describe a relationship between one element or feature and other elements or features as illustrated in the figures. It is to be understood that in addition to the orientation shown in the figures, the spatial relationship terms further include different orientations of a device in use and operation. For example, if the device in the figures is turned over, the element or feature described as "underneath the other element" or "below it" or "under it", the element or feature will be oriented "over/above" the other element or feature. Therefore, the exemplary terms "underneath" and "below" may include both upper and lower orientations. In addition, the device may also include additional orientations (for example, is rotated 90 degrees or other orientations), and the spatial descriptors used herein are interpreted accordingly.

As used herein, the singular forms "a", "an", and "/the" may include the plural forms as well, unless the context clearly indicates otherwise. It is also to be understood that when the terms "constituting" and/or "comprising/including" are used in the specification, the presence of a feature, integer, step, operation, element, and/or component may be determined, but the presence or addition of one or more other features, integers, steps, operations, elements, components, and/or groups is not excluded. Meanwhile, the term "and/or" used herein includes any and all combinations of the associated listed items.

The embodiments of the disclosure are described herein with reference to cross sectional views that are used as schematic diagrams of ideal embodiments (intervening structures) of the present disclosure, so that changes in shape due to, for example, a manufacturing technique and/or a tolerance may be expected. Therefore, the embodiments of the present disclosure should not be limited to special shapes of regions shown herein but include shape deviations caused by the manufacturing technique.

In one embodiment, please refer to FIG. 1, a manufacturing method of a semiconductor structure is provided, which includes the following steps.

Figure 3:
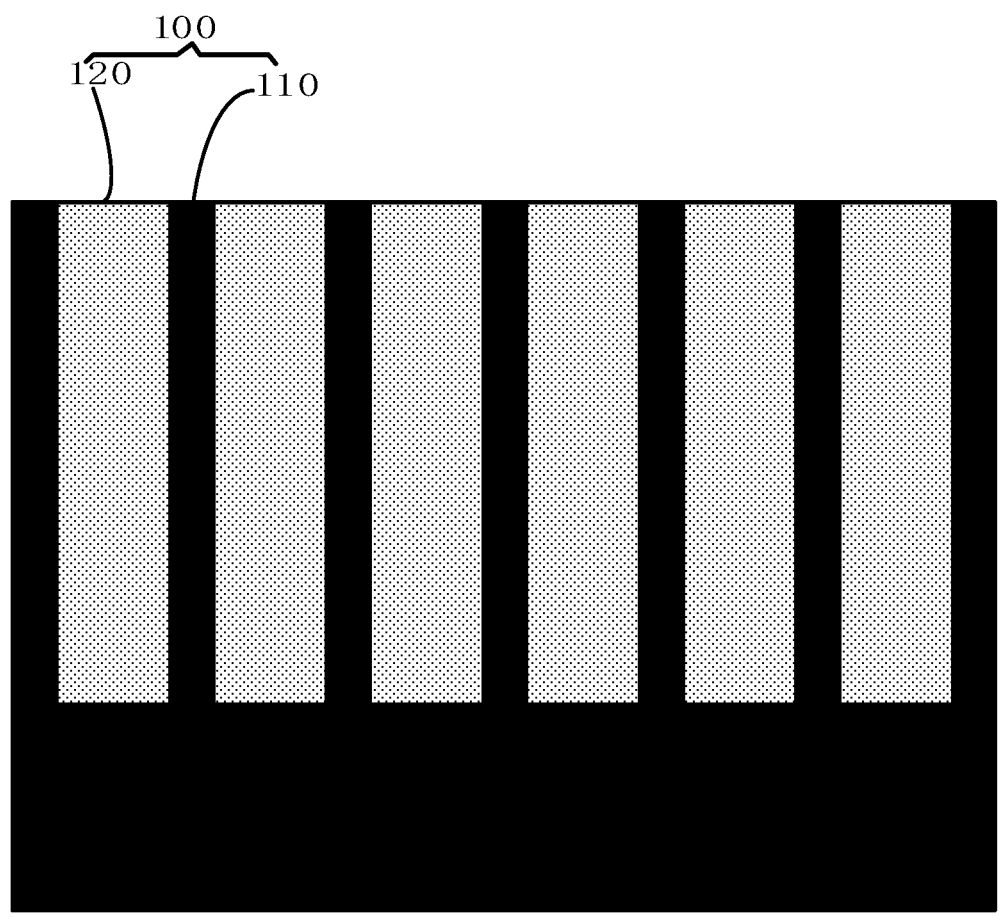

At S100, a substrate 100 is provided, the substrate including active regions 110 and isolation regions 120, please refer to FIG. 3.

Figure 5:
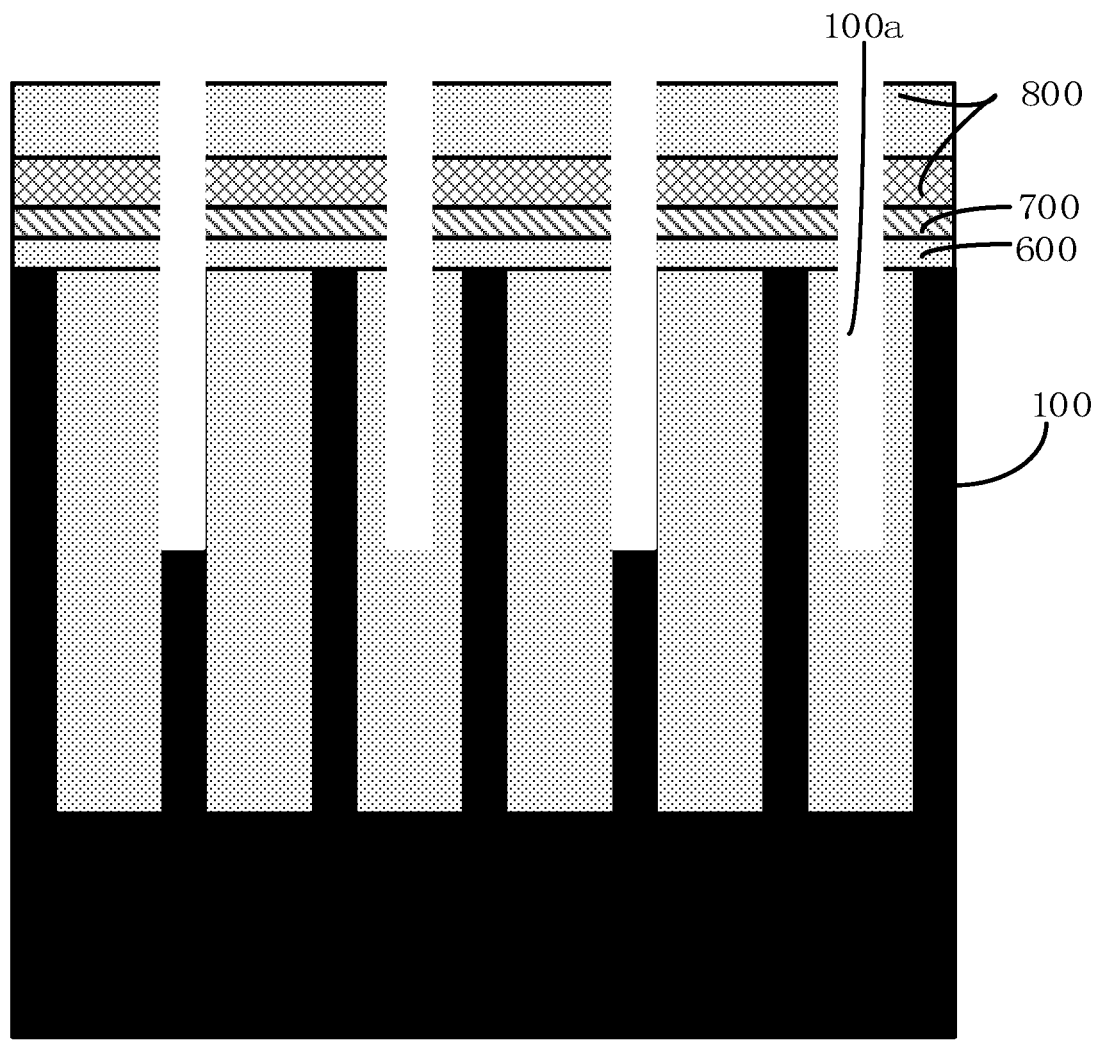

At S200, first trench structures 100a are formed in the substrate 100, the first trench structure 100a passing through the active region 110 and the isolating region 120, please refer to FIG. 5.

Figure 9:
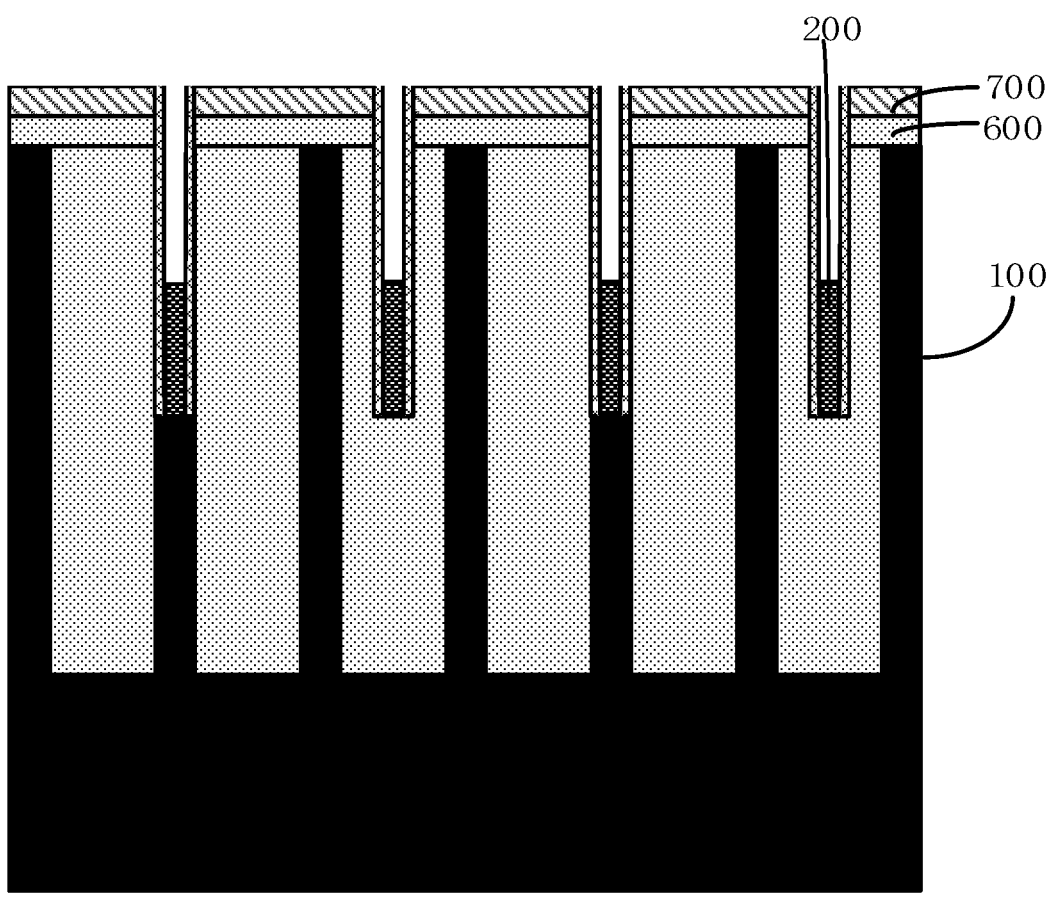

At S500, bit line contact structures 200 are formed in the first trench structures 100a, an upper surface of the bit line contact structure 200 being lower than an upper surface of the substrate 100, please refer to FIG. 9.

Figure 11:
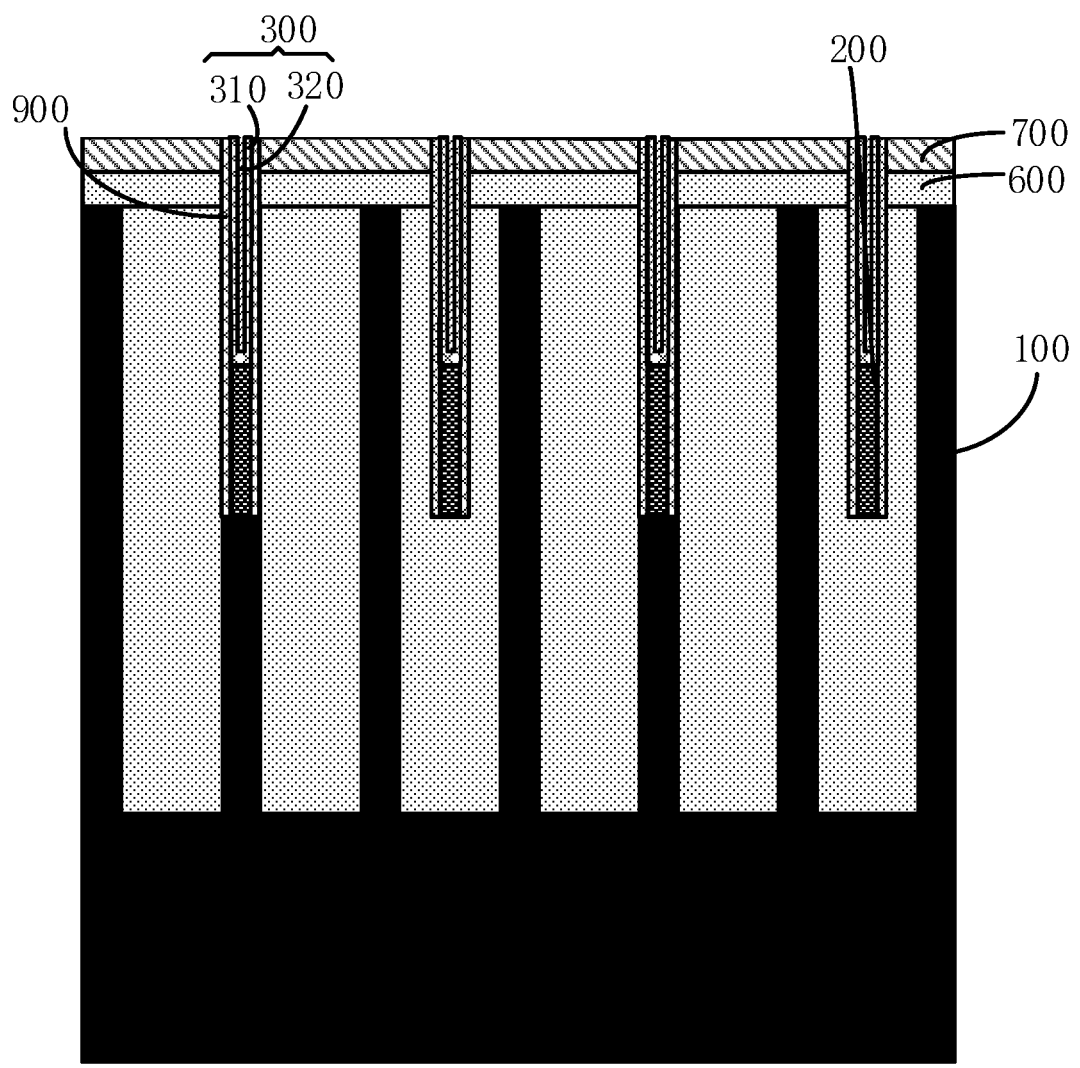

At S600, bit line structures 300 are formed on the bit line contact structures 200, the first trench structure 100a being filled up with the bit line contact structure 200 and the bit line structure 300, and at least part of the bit line structure 300 being positioned in the first trench structure 100a, please refer to FIG. 11.

Figure 14:
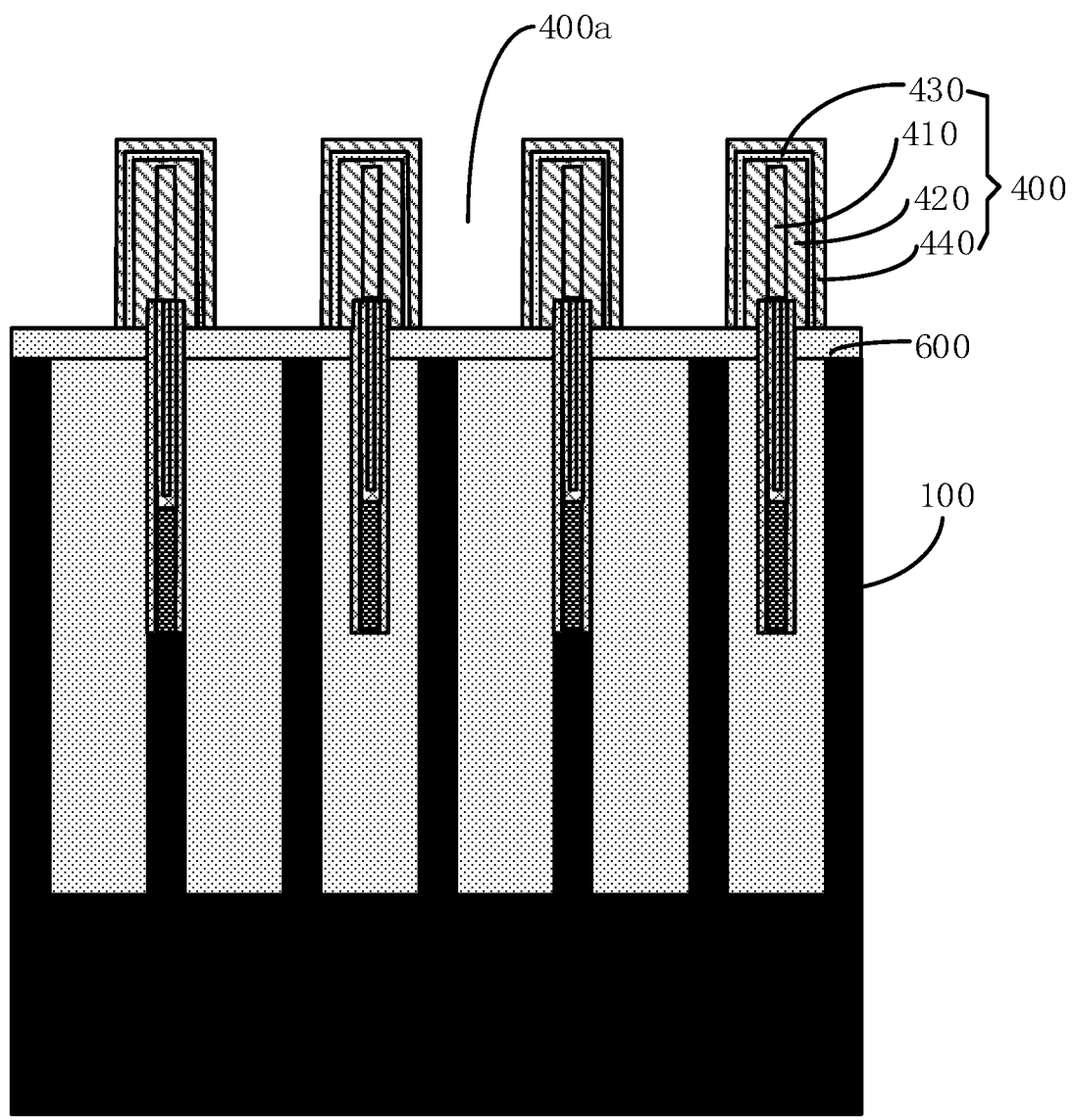

At S700, bit line protection structures 400 are formed on the bit line structures 300, the bit line protection structure 400 at least covering an upper surface of the bit line structure 300, and a second trench structure 400a being provided between adjacent bit line protection structures 400, please refer to FIG. 14.

Figure 23:
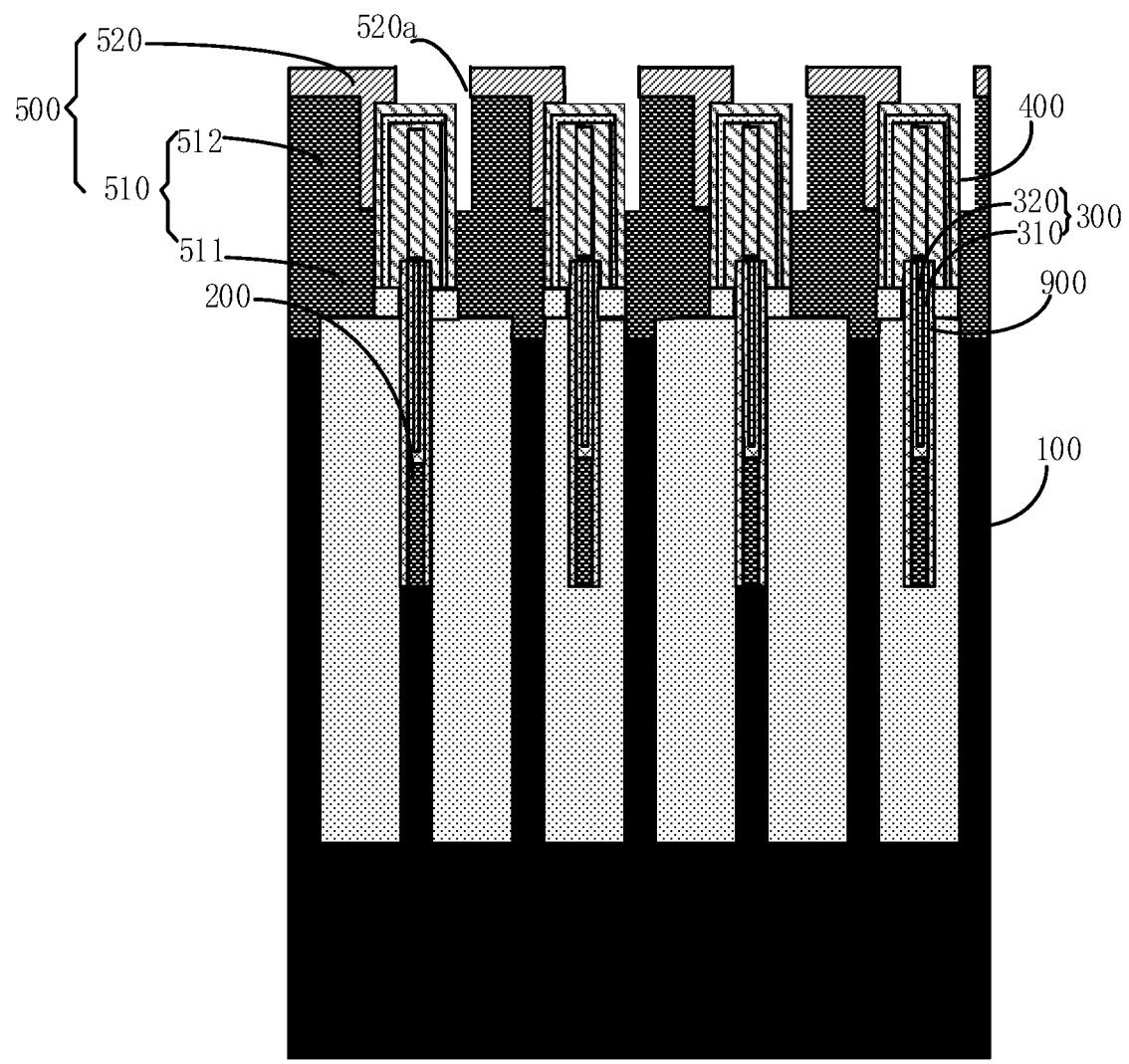
FIG. 23 is a schematic structural diagram showing a semiconductor structure provided in an embodiment.

At S800, capacitor contact assemblies 500 each including a first capacitor contact structure 510 and a second capacitor contact structure 520 are formed, herein the first capacitor contact structure 510 is positioned in the second trench structure 400a and the second capacitor contact structure 520 covers an upper surface of the first capacitor contact structure 510 and a part of a side wall of the first capacitor contact structure 510, please refer to FIG. 23.

At S100, please refer to FIG. 3, the substrate 100 includes active regions 110 and isolation regions 120.

Figure 2:
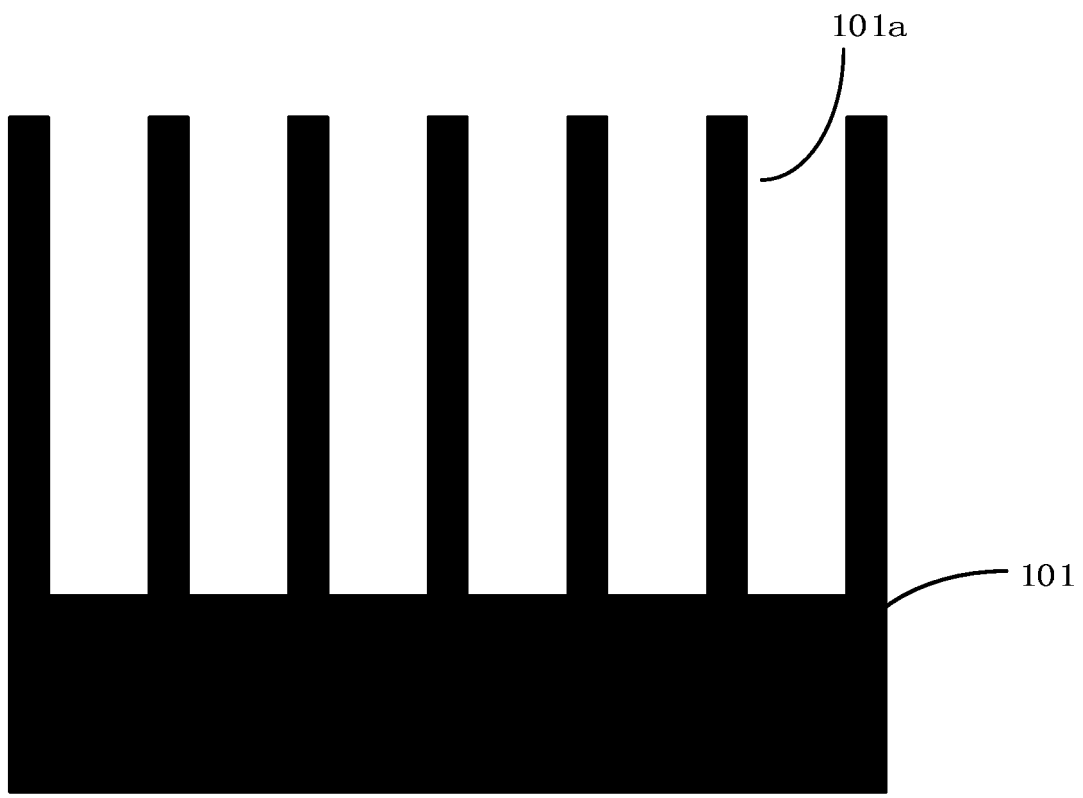
FIG. 2 to FIG. 22 are schematic sectional or top-view structural diagrams of structures obtained during a manufacturing process of a semiconductor structure provided in an embodiment.

A forming process of the substrate 100 may include the following operations. A plurality of shallow trench structures 101a are firstly formed in a semiconductor substrate 101 (for example a silicon substrate), please refer to FIG. 2. Then, the shallow trench structures are filled up with an insulating medium (for example silicon oxide) to form shallow trench isolation structures. Regions in which the shallow trench isolation structures are located is the isolation regions 120, and the semiconductor substrate is isolated into a plurality of active regions 110 which are arranged at intervals through the shallow trench isolation structures, please refer to FIG. 3.

At S200, the first trench structure 100a is configured to form the bit line structure 300. The same first trench structure 100a passes though the active region 110 and the isolation region 120, such that the bit line structure formed in the same first trench structure 100a is electrically connected to a source or drain electrode in each memory cell on the same line.

FIG. 5 is a sectional structural diagram of the substrate 100 after first trench structures 100a are formed on the substrate.

At S500, the bit line contact structure 200 may effectively adjust the electrical properties of a finally formed device, so that the yield of the device is increased.

As an example, the material of the bit line contact structure 200 may be heavily doped polysilicon, and doped ions in the polysilicon may be phosphor ion, boron ion and the like. The electrical properties of the finally formed device may be adjusted by adjusting doped ion concentration in the polysilicon so as to meet application needs.

At S600, all or part of the bit line structure 300 is positioned in the first trench structure 100a. That is, at least part of the bit line structure 300 is embedded into the substrate 100.

As an example, the material of the bit line structure 300 may include metal tungsten (W) and the like.

At S700, the bit line protection structure 400 is provided corresponding to the bit line structure 300 and the bit line contact structure 200. A group of the bit line protection structure 400, the bit line structure 300 and the bit line contact structure 200 corresponding to each other forms a bit line.

The bit line protection structure 400 may effectively insulate and protect the corresponding bit line structure 300.

The bit line protection structures 400 are spaced apart from each other, and a second trench structure 400a is provided between adjacent bit line protection structures 400. The second trench structures 400a are used for forming of capacitor contact assemblies 500 subsequently.

At S800, the first capacitor contact structure 510 may effectively reduce contact resistance between the active region 110 and the second capacitor contact structure 520. The second capacitor contact structure 520 is configured to electrically connect to a capacitor structure.

As an example, the material of the first capacitor contact structure 510 may be heavily doped polysilicon, and the like. The material of the second capacitor contact structure 520 may be metal tungsten and the like.

In the embodiment, at least part of the bit line structure 300 may be embedded into the substrate 100, so that the height of the bit line outside the first trench structure 100a is reduced. In such a manner, the overall structural stability of the bit line is effectively improved.

Meanwhile, the second trench structure 400a between the bit lines outside the first trench structures 100a is used for filling of the first capacitor contact structure 510. If its height is too high, a filling gap is easily formed in a process of filling the first capacitor contact structure 510, so that the resistance value of the capacitor contact structure is affected.

In the embodiment, at least part of the bit line structure 300 is embedded into the substrate 100, so that the height of the bit line outside the first trench structure 100a is reduced. Accordingly, the trench depth of the second trench structure 400a is also reduced, so that the height of the first capacitor contact structure 510 filled in the second trench structure 400a is reduced.

As a result, a filling gap may be effectively prevented from being formed during the process of filling the first capacitor contact structure 510 in the embodiment, thereby improving the filling quality of the first capacitor contact structure 510 and further effectively reducing the resistance value of the first capacitor contact structure 510.

In addition, in the embodiment, the second capacitor contact structure 520 of the capacitor contact assembly 500 covers an upper surface of the first capacitor contact structure and part of a side wall of the first capacitor contact structure 510, so that contact area between the two is effectively increased. In such a manner, charge transfer between the capacitor structure and a source or drain electrode of the active region is favorably realized.

In one embodiment, S200 includes the following operations.

Figure 4:
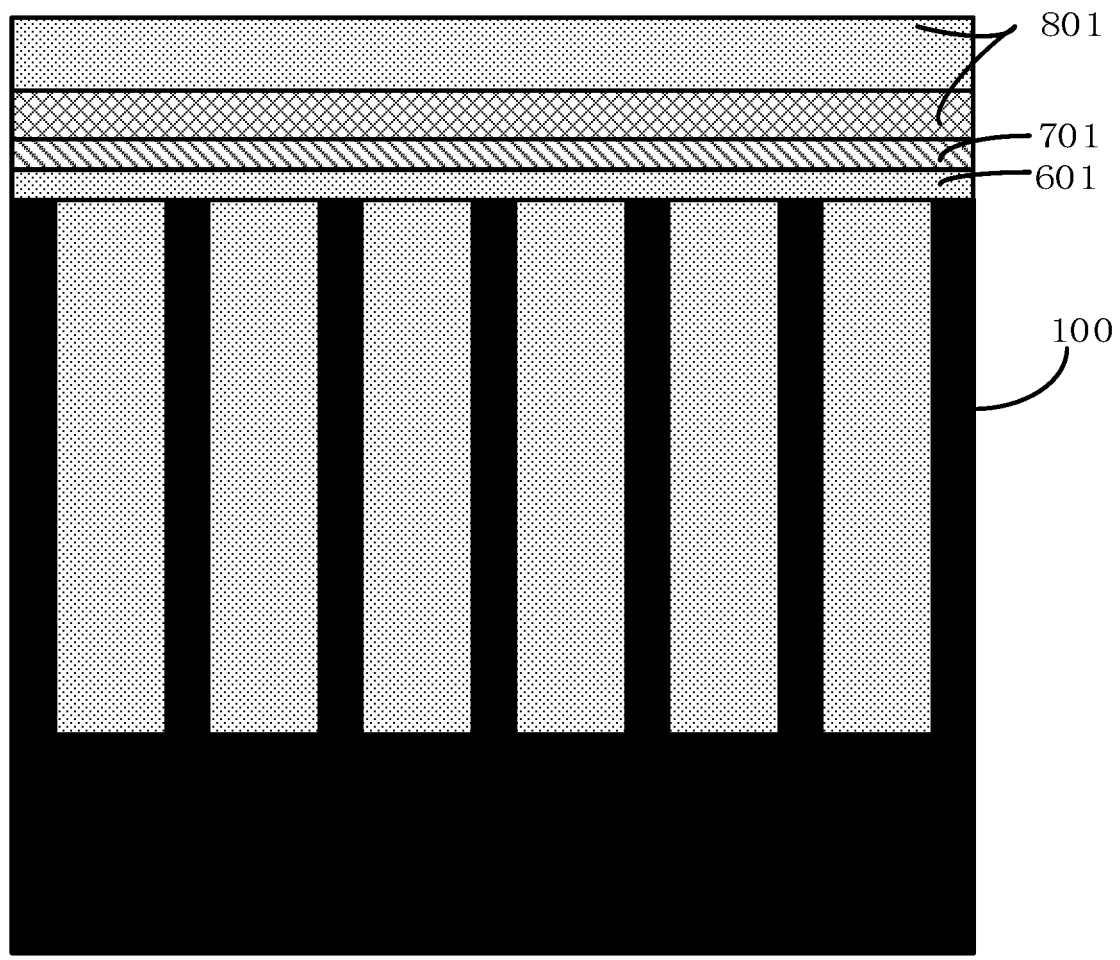

At S210, a stress buffer material layer 601, an etching blocking material layer 701 and a first mask material layer 801 are formed on the substrate 100 in sequence, please refer to FIG. 4.

At S220, the first mask material layer 801 is patterned to form a first mask layer 800, please refer to FIG. 5.

At S230, part of the etching blocking material layer 701, part of the stress buffer material layer 601 and part of the substrate 100 are etched by taking the first mask layer 800 as a mask, please refer to FIG. 5.

In S210, the material of the stress buffer material layer 601 may be, but not limited to, silicon oxide and the like. The material of the etching blocking material layer 701 may be, but not limited to, silicon nitride and the like. The first mask material layer 801 may include one layer of film, and also may include multiple layers of films. As an example, the first mask material layer 801 may include a polysilicon material layer, a silicon oxide material layer and the like which are formed on the etching blocking material layer 701 in sequence.

At S220, the first mask material layer 801 may be exposed, developed, etched and the like through a photo-lithographic process, to form a first mask layer 800.

At S230, the etching blocking material layer 701, the stress buffer material layer 601 and the substrate 100 are etched in sequence by taking the first mask layer 800 as a mask and by selecting respective proper etching gas.

After etching is performed, the rest of the etching blocking material layer 701 constitutes an etching blocking layer 700, and the rest of the stress buffer material layer 601 constitutes a stress buffer layer 600. After being etched, the substrate 100 is formed with first trench structures 100a.

In one embodiment, after S200 and before S500, the following operations are further included.

Figure 6:
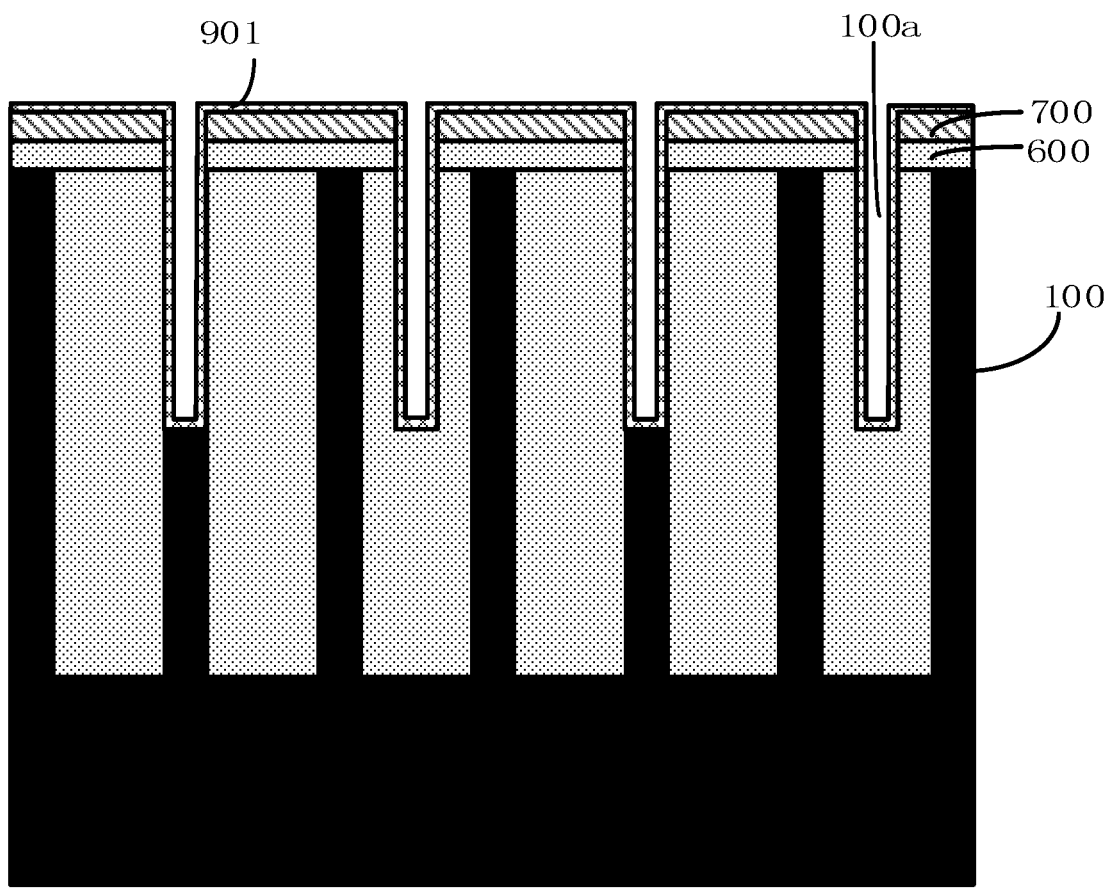

At S300, the first mask layer 800 is removed, please refer to FIG. 6.

Figure 7:
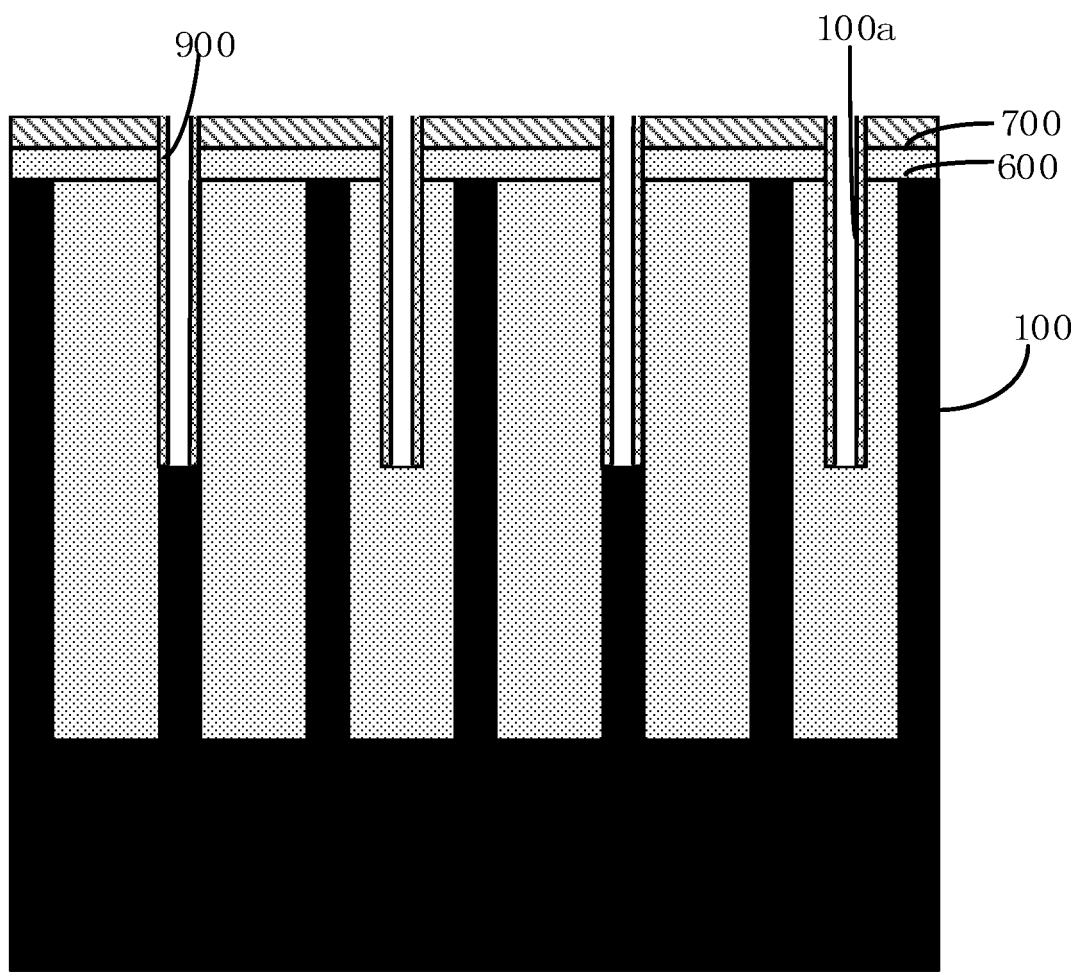

At S400, first side wall protection layers 900 each covering a side wall of the first trench structure 100a is formed, please refer to FIG. 7.

In S300, the etching blocking layer 700 is exposed out after the first mask layer 800 is removed.

At S400, the first side wall protection layer 900 is configured to prevent a subsequently formed bit line structure 300 from penetrating into the shallow trench isolating structure in the isolation region 120, which may cause reduction of the properties of the device.

As an example, the material of the first side wall protection layer 900 may be titanium nitride.

Here, the first side wall protection layer 900 is formed before the bit line contact structure 200 is formed. Certainly, the present disclosure is not limited hereto, and the first side wall protection layer 900 also may be formed after the bit line contact structure 200 is formed and before the bit line structure 300 is formed.

In one embodiment, S400 includes the following operations.

At S410, a first side wall material layer 901 covering a surface of the etching blocking layer 700, and side walls and bottoms of the first trench structures 100a is formed, please refer to FIG. 6.

At S420, please refer to FIG. 7, the first side wall material layer 901 on the surface of the etching blocking layer 700 and the first side wall material layer 901 on the bottoms of the first trench structures 100a are removed through an etching process.

In S410, the material of the first side wall material layer 901 may be titanium nitride, and the like.

In S420, the rest of the first side wall material layer 901 is the first side wall protection layers 900 after part of the first side wall material layer 901 is removed.

In one embodiment, S500 includes the following operations.

Figure 8:
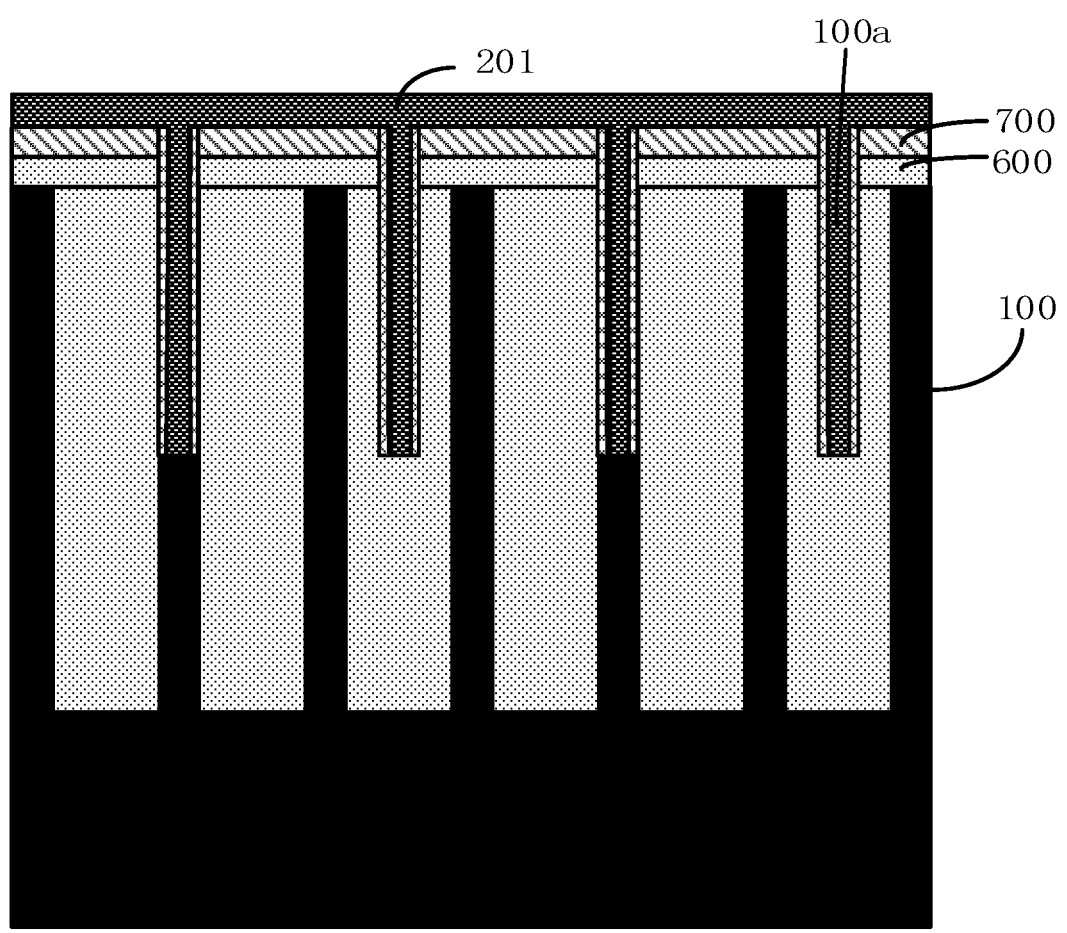

At S510, please refer to FIG. 8, a bit line contact material layer 201 filling the first trench structures 100a and covering the surface of the etching blocking layer 700 is formed.

At S520, please refer to FIG. 9, the bit line contact material layer 201 on the surface of the etching blocking layer 700 and part of the bit line contact material layer 201 in each of the first trench structures 100a are removed through an etching process.

In S520, the rest of the bit line contact material layer 201 constitutes the bit line contact structures 200 after part of the bit line contact material layer 201 is removed through the etching process.

In one embodiment, S600 includes the following operations.

Figure 10:
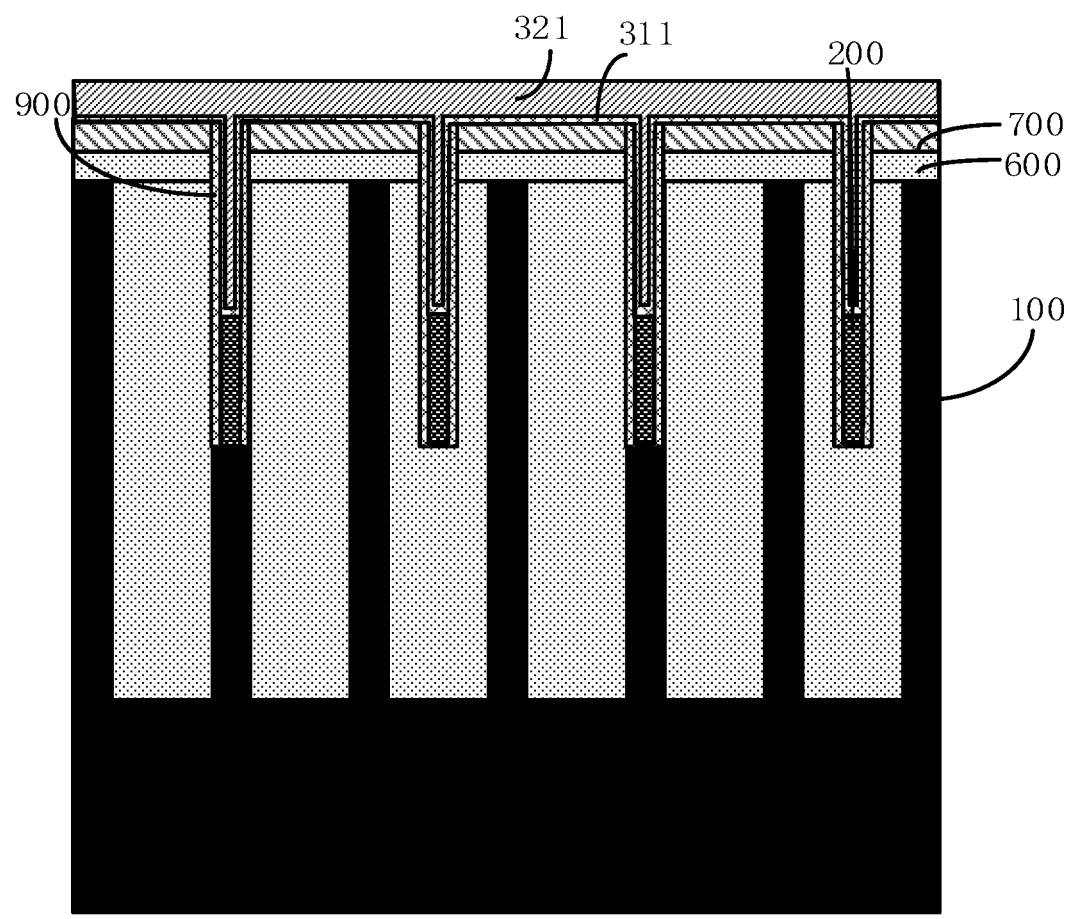

At S610, please refer to FIG. 10, a metal blocking material layer 311 covering surfaces of the bit line contact structures 200 and the surface of the etching blocking layer 700 is formed.

At S620, please refer to FIG. 10, a first metal electrically conductive material layer 321 covering a surface of the metal blocking material layer 311 is formed.

At S630, please refer to FIG. 11, the metal blocking material layer 311 and the first metal electrically conductive material layer 321 above the etching blocking layer 700 are removed, the rest of the metal blocking material layer 311 constitutes metal blocking layers 310, and the rest of the first metal electrically conductive material layer 321 constitutes first metal electrically conductive layers 320.

The metal blocking layer 310 and the first metal electrically conductive layer 320 constitute the bit line structure 300.

In S610, the metal blocking material layer 311 is configured to prevent a subsequently formed metal blocking material layer 311 from penetrating into the bit line contact structure 200, which may cause reduction of the properties of the device. As an example, the material of the metal blocking material layer 311 may be titanium nitride.

In S620, the material of the first metal electrically conductive material layer 321 may be a material with good electrical conductivity, such as metal tungsten.

In S630, part of the metal blocking material layer 311 and part of the first metal electrically conductive material layer 321 may be removed through an etching process.

As an example, S630 may include the following operation.

By taking the etching blocking layer 700 as a stop layer, the metal blocking material layer 311 and the first metal electrically conductive material layer 321 above the etching blocking layer are removed through a chemical mechanical polishing process.

In one embodiment, S700 includes the following operations.

Figure 13:
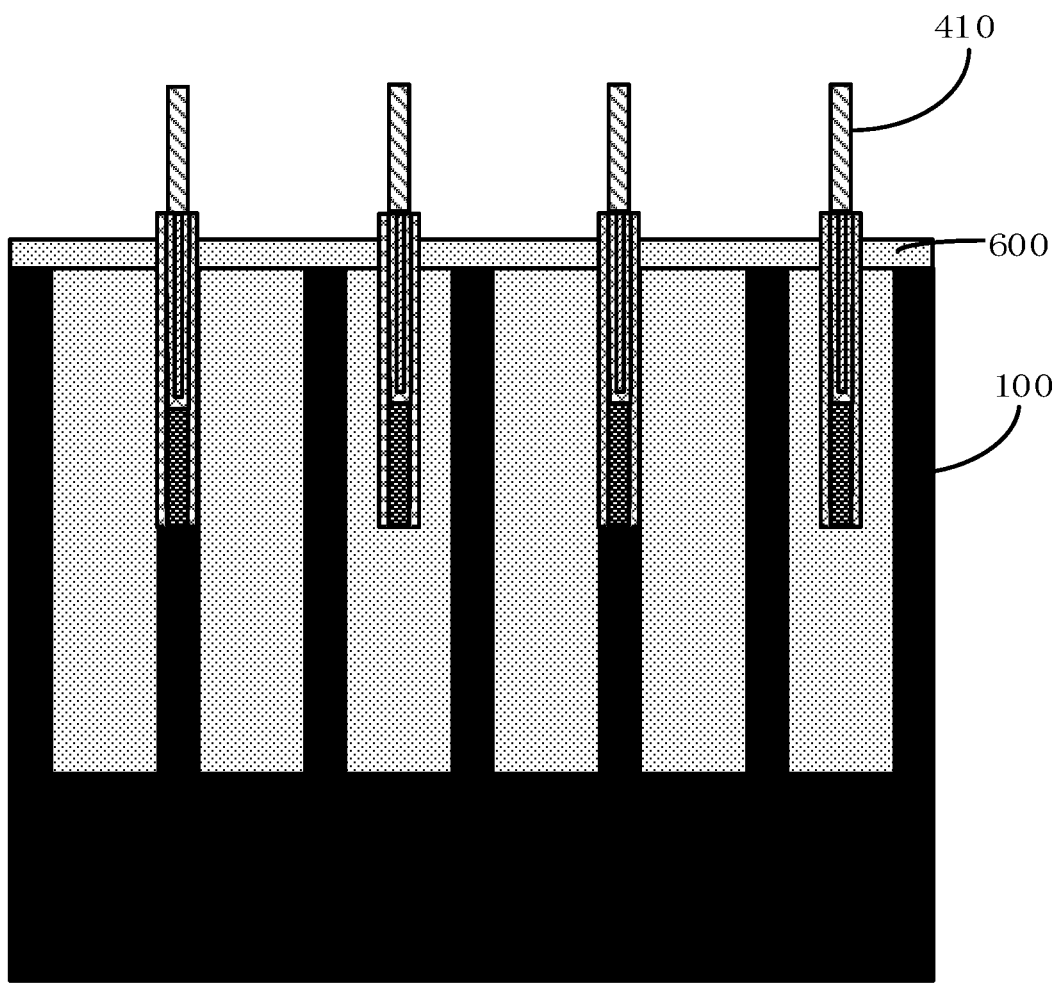

At S710, please refer to FIG. 13, first dielectric layers 410 covering upper surfaces of the bit line structures 300 are formed.

At S720, please refer to FIG. 14, first insulating layers 420 covering surfaces of the first dielectric layers 410 are formed.

At S730, please refer to FIG. 14, the second insulating layers 430 covering surfaces of the first insulating layers 420 are formed.

At S740, please refer to FIG. 14, third insulating layers 440 covering surfaces of the second insulating layers 430 are formed.

The first dielectric layers 410, the first insulating layers 420, the second insulating layers 430 and the third insulating layers 440 constitute the bit line protection structures 400.

As an example, S710 may include the following operations.

Figure 12:
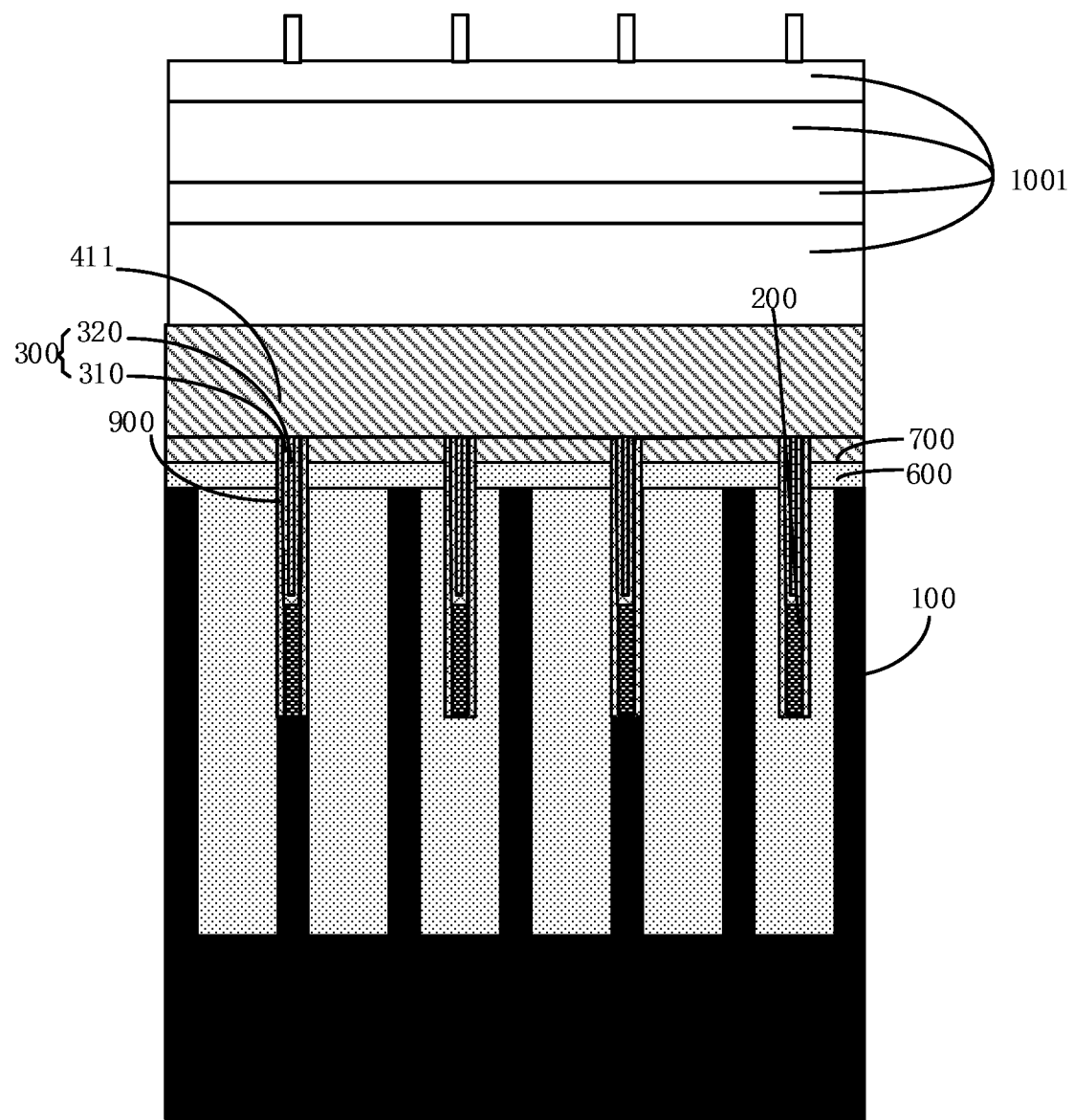

At S711, please refer to FIG. 12, a first dielectric material layer 411 covering the etching blocking layer 700 and the bit line structures 300 is formed.

At S712, please refer to FIG. 13, the first dielectric material layer 411 above the etching blocking layer 700 and the etching blocking layer 700 are removed through an etching process, and the rest of the first dielectric material layer 411 constitutes the first dielectric layers 410.

At this point, the material of both the first dielectric material layer 411 and the etching blocking layer 700 may be silicon nitride, and thus can be removed in the same process.

Specifically, a second mask material layer 1001 may be firstly formed on the first dielectric material layer 411, please refer to FIG. 12. The second mask material layer 1001 specifically may include one layer of film, and also may include multiple layers of films. Then, the second mask material layer 1001 is patterned through a photolithographic process to form a second mask layer. The first dielectric material layer 411 above the etching blocking layer 700 and the etching blocking layer 700 are removed by etching based on the second mask layer.

At S720, the material of the first insulating layer 420 may be the same with that of the first dielectric layer 410, which may be silicon nitride.

At S730, the material of the second insulating layer 430 may be silicon oxide.

At S740, the material of the third insulating layer 440 may be silicon nitride.

In one embodiment, the step of forming the first capacitor contact structures 510 in S800 further includes the following operations.

Figure 17:
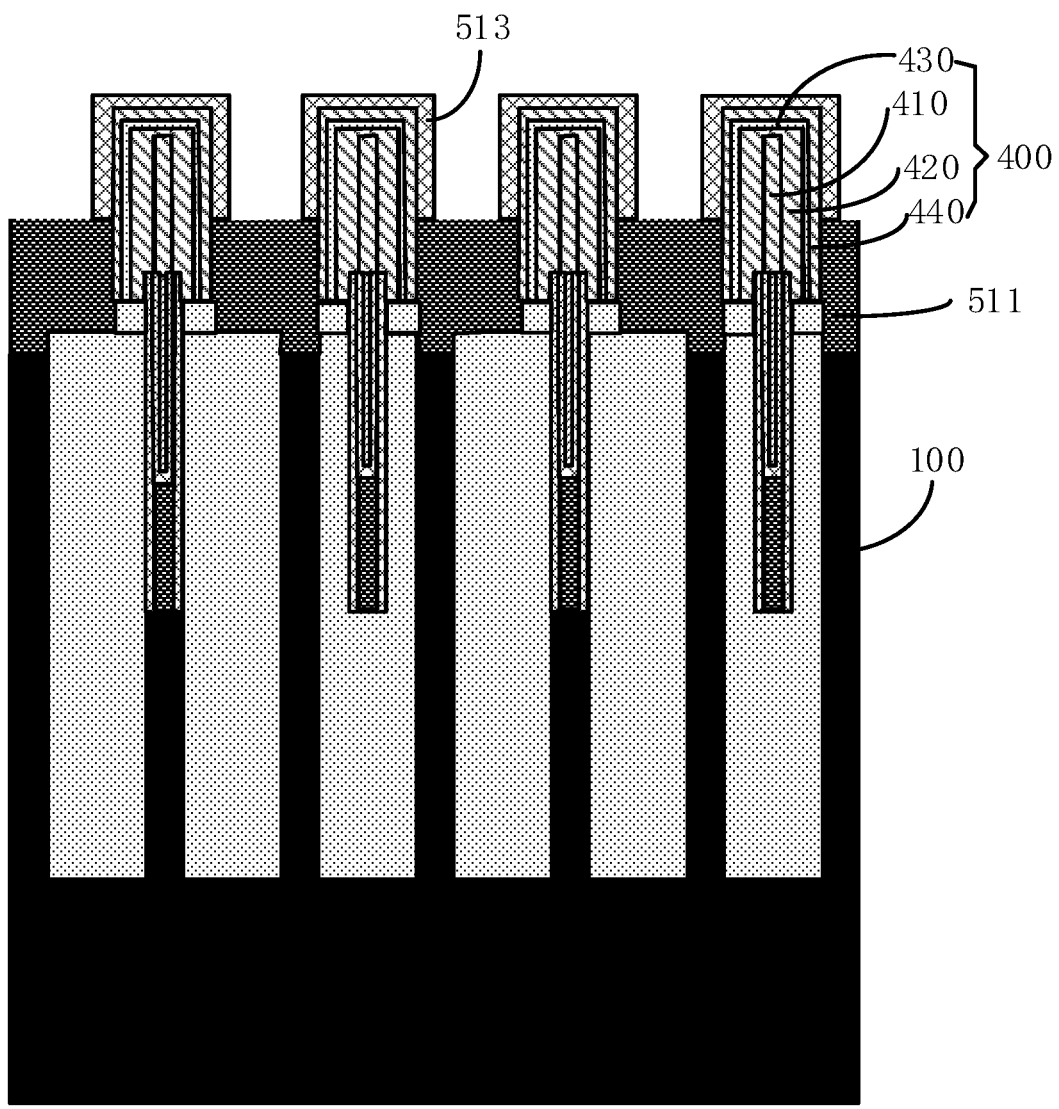

At S810, please refer to FIG. 17, first polysilicon layer 511 positioned in the second trench structures 400a are formed, an upper surface of the first polysilicon layer 511 being lower than an upper surface of the bit line protection structure 400.

At S820, please refer to FIG. 17, first sacrificial layers 513 each covering an upper surface and part of a side wall of the bit line protection structure 400 are formed.

Figure 19:
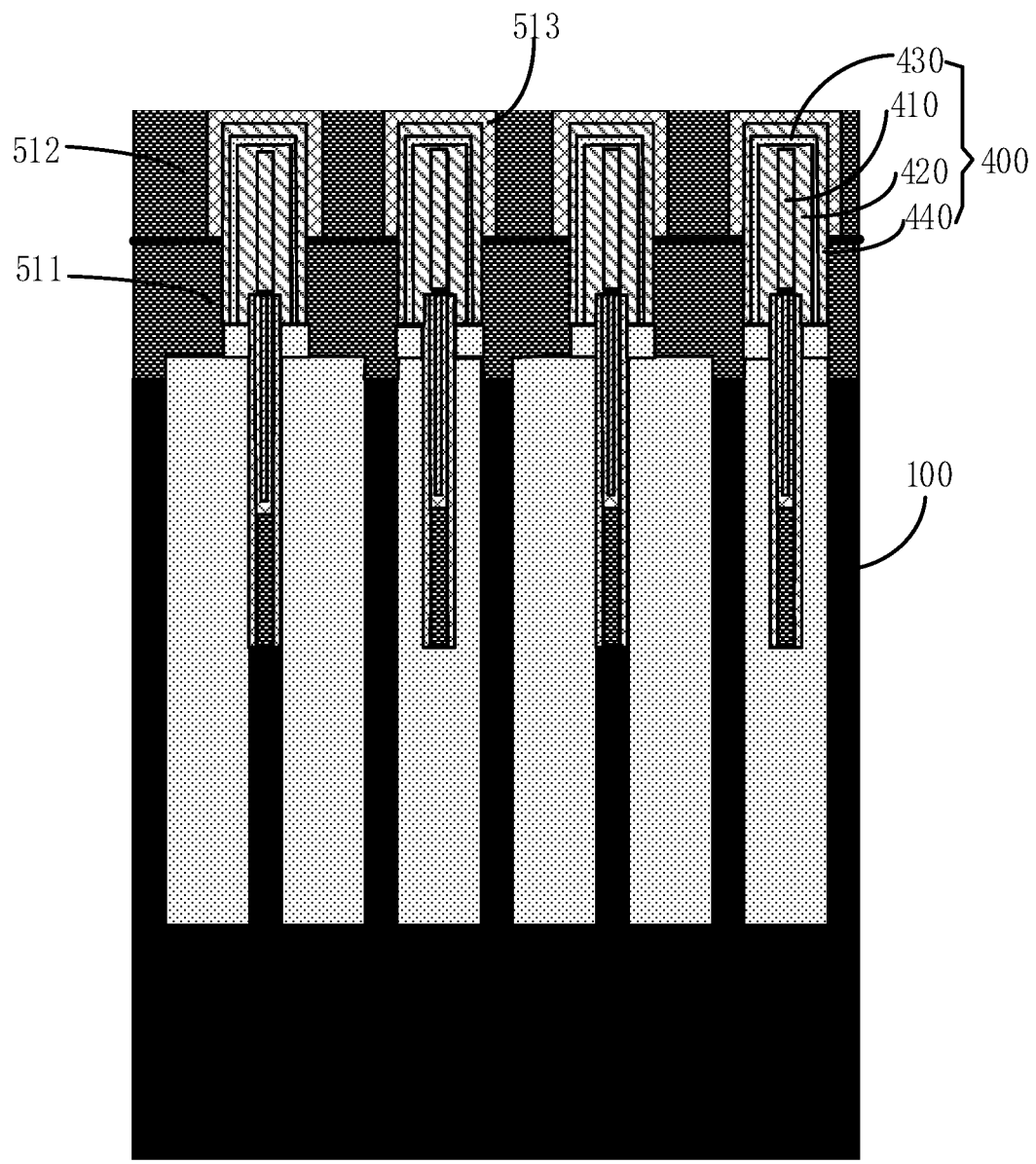

At S830, please refer to FIG. 19, second polysilicon layers 512 are formed. The second polysilicon layer 512, the first polysilicon layer 511 and the first sacrificial layer 513 fill up the second trench structure 400a, and an upper surface of the second polysilicon layer 512 is flush with an upper surface of the first sacrificial layer 513.

Figure 20:
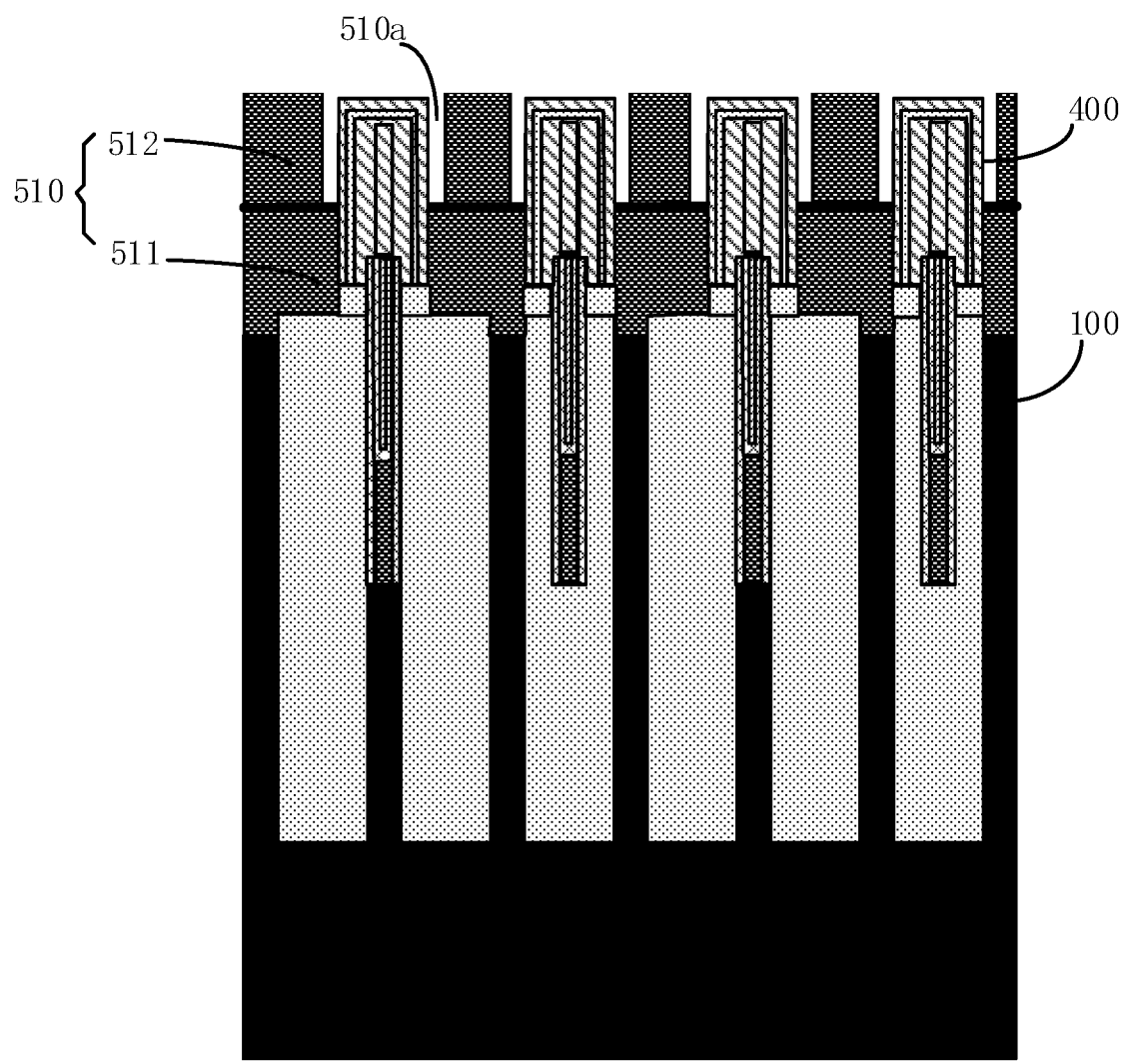

At S840, please refer to FIG. 20, the first sacrificial layers 513 are removed to form third trench structures 510a.

The first polysilicon layer 511 and the second polysilicon layer 512 constitute the first capacitor contact structure 510.

Figure 15:
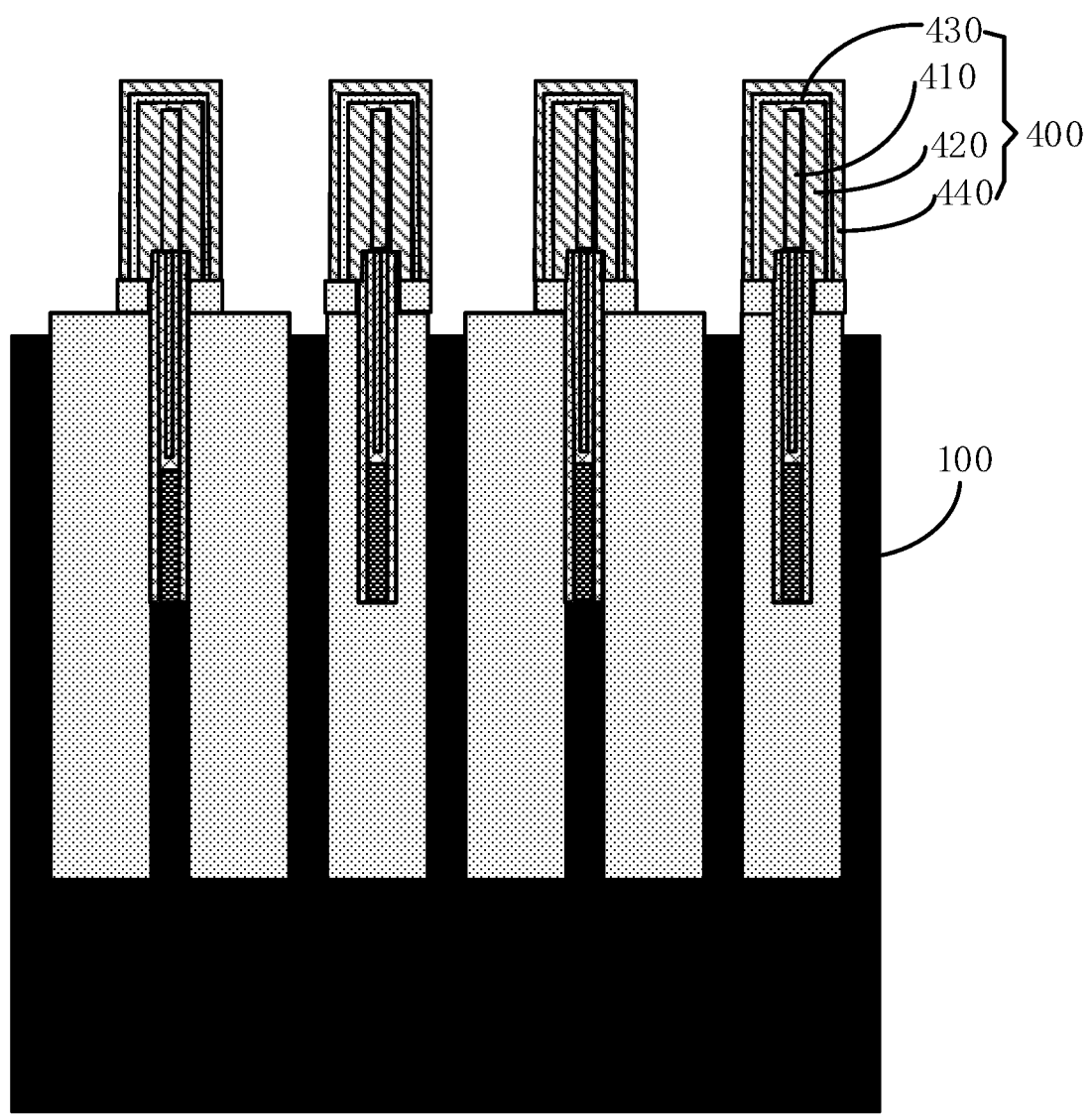

It can be understood that the capacitor contact assembly 500 is configured to electrically connect the active region 110 to the capacitor structure. As a result, before the first capacitor contact structure 510 is formed, part of the stress buffer layer 600 further needs to be removed, please refer to FIG. 14 and FIG. 15.

Figure 16:
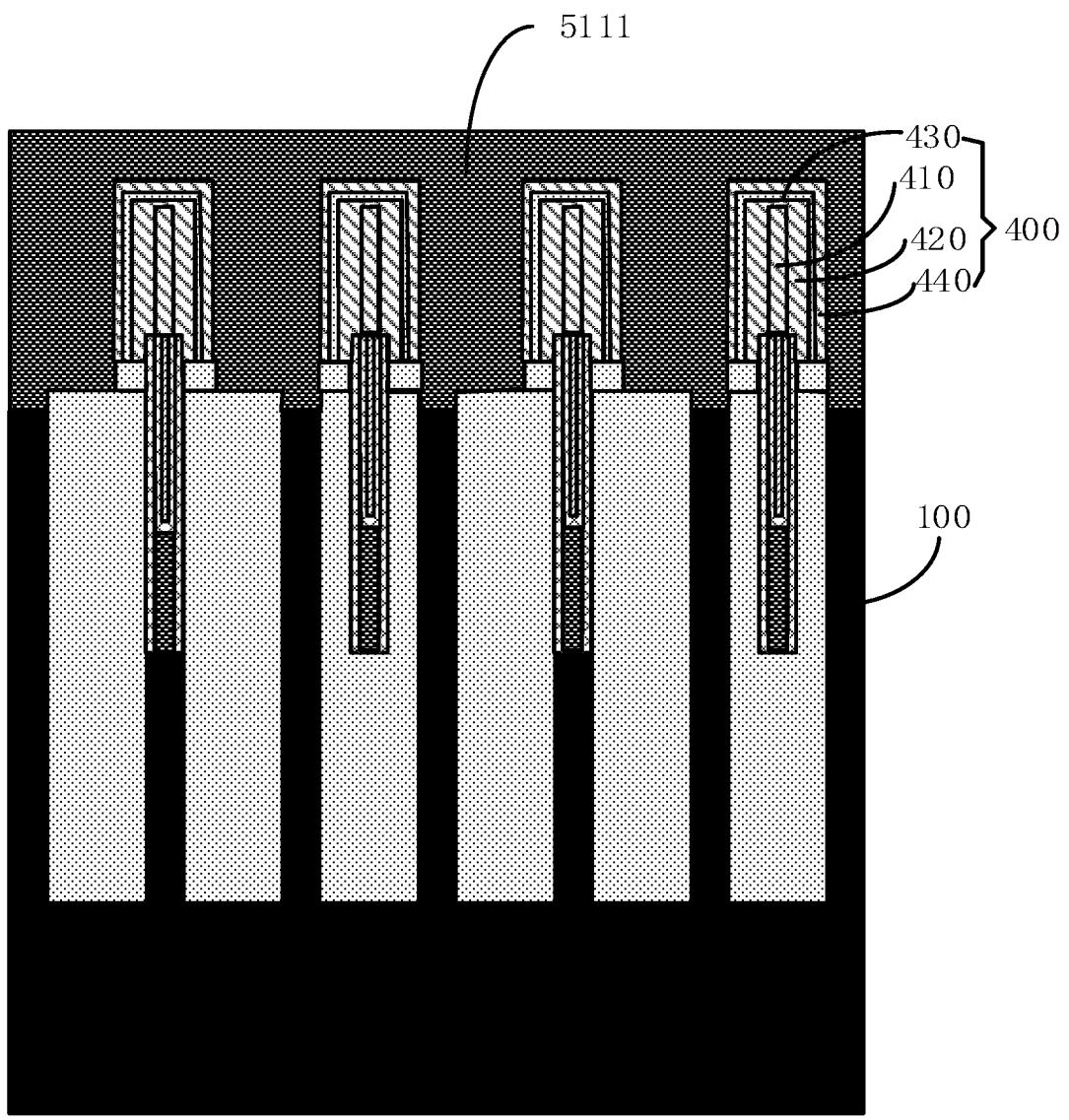

At S810, please refer to FIG. 16, a first polysilicon material layer 5111 may be firstly formed, an upper surface of the first polysilicon material layer 5111 being higher than an upper surface of the bit line protection structure 400. Then, the first polysilicon material layer 5111 is etched back, and the rest of the first polysilicon material layer 5111 constitutes the first polysilicon layers 511, please refer to FIG. 17.

At S820, the material of the first sacrificial layer 513 may be titanium nitride, and the material of the third insulating layer 440 may be silicon nitride.

Figure 18:
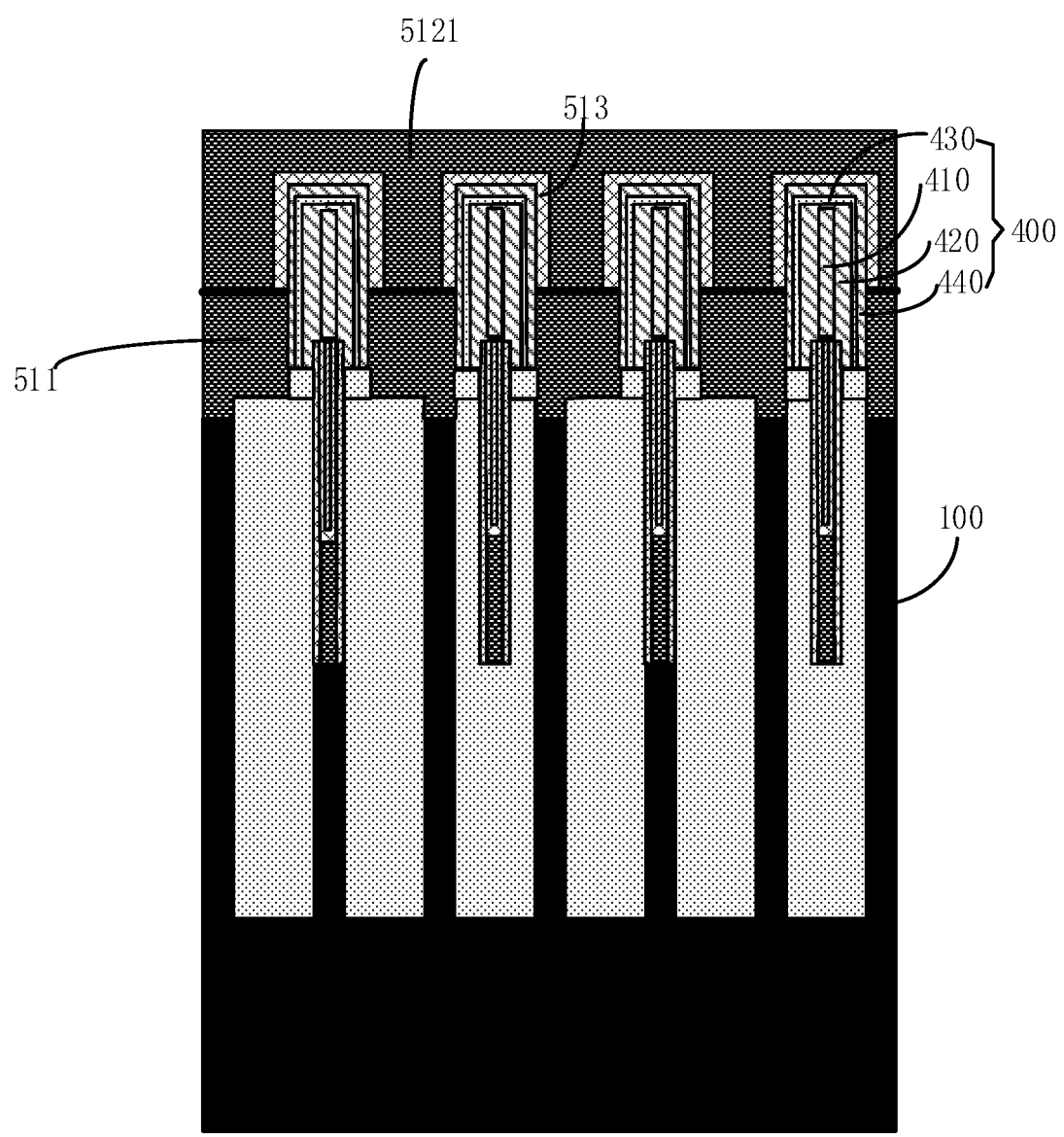

In the process of forming the second polysilicon layers 512 in S830, a second polysilicon material layer 5121 may be firstly formed, an upper surface of the second polysilicon material layer 5121 being higher than an upper surface of the first sacrificial layer 513, please refer to FIG. 18. Then, by taking the third insulating layer 440 as a stop layer, the second polysilicon material layer above the third insulating layer 440 is removed through a chemical mechanical polishing process, and the rest of the second polysilicon material layer constitutes the second polysilicon layers 512, please refer to FIG. 19.

In the embodiment, after the first polysilicon layer 511 is formed and before the second polysilicon layer 512 is formed, the first sacrificial layer 513 is formed and then first sacrificial layer is removed after the second polysilicon layer 512 is formed. In such a manner, the side walls of the first capacitor contact structures 510 are effectively exposed out. At this point, a subsequently formed second capacitor contact structure 520 may be in contact with the upper surface and the side wall of the first capacitor contact structure 510 simultaneously, so that contact area is increased, thereby reducing contact resistance.

In one embodiment, the step of forming the second capacitor contact structures 520 in S800 further includes the following operations.

Figure 21:
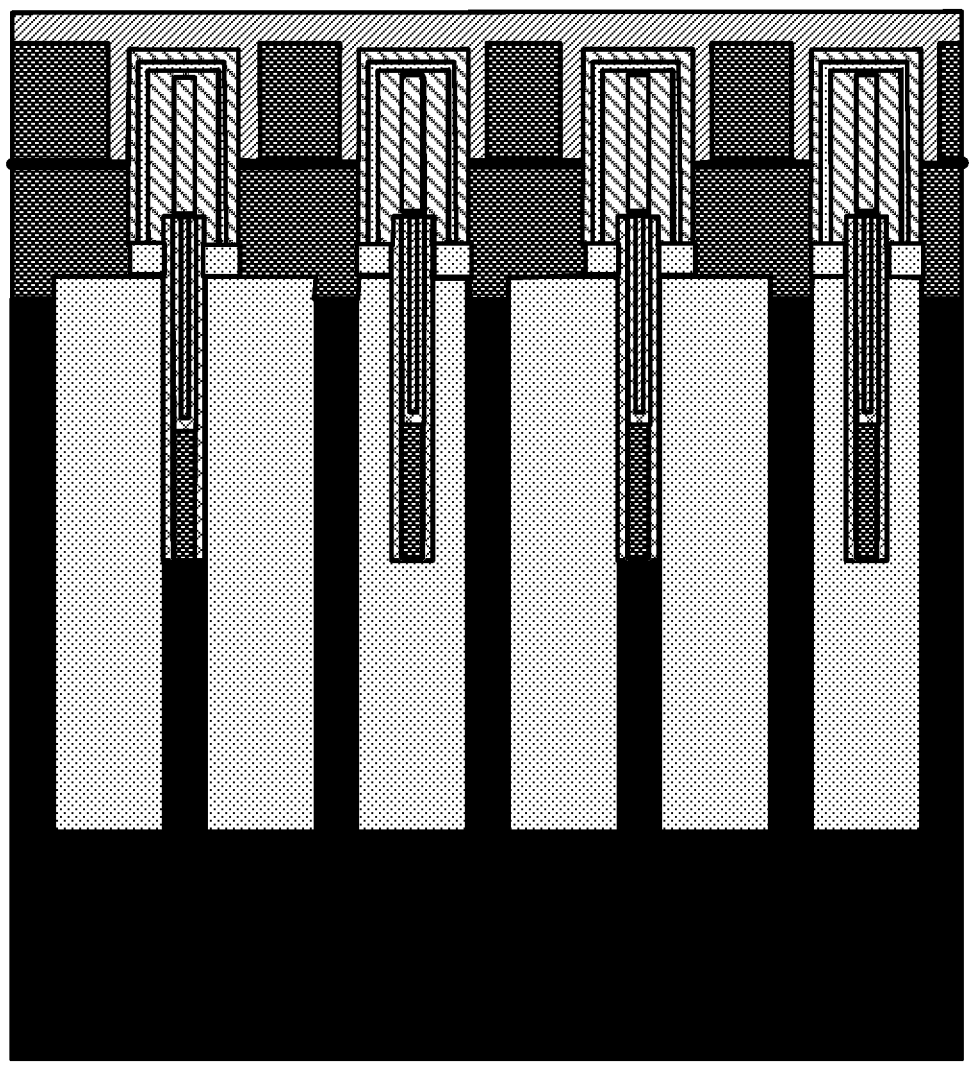

At S850, please refer to FIG. 21, a second metal electrically conductive material layer 521 covering the first capacitor contact structures 510 and the upper surfaces of the bit line protection structures 400, and filling up the third trench structures 510*a* is formed.

At S860, please refer to FIG. 23, part of the second metal electrically conductive material layer 521 is removed to form fourth trench structures 520*a*.

The rest of the second metal electrically conductive material layer 521 constitutes second capacitor contact structures 520, the second capacitor contact structures 520 are spaced apart from the fourth trench structures 520*a* and the second capacitor contact structures 520 correspond to the fourth trench structures 520*a*.

Figure 22:
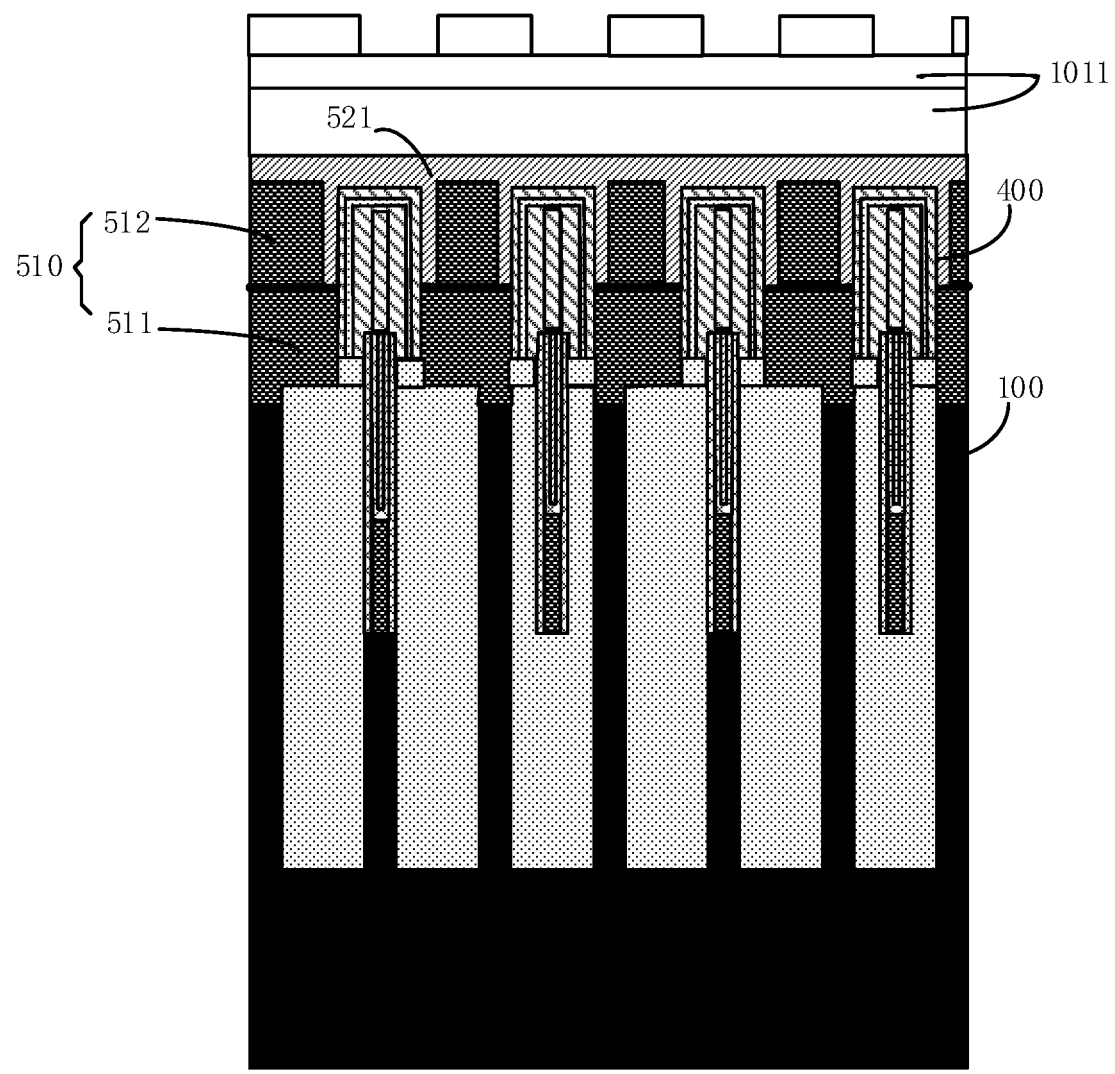

In S860, specifically, a third mask material layer 1011 may be formed on the second metal electrically conductive material layer 521, please refer to FIG. 22. The third mask material layer 1011 specifically may include one layer of film layer, and also may include multiple layers of films. Then, third mask material layer 1011 is patterned through a photolithographic process to form a third mask layer. Part of the second metal electrically conductive material layer 521 is removed by etching based on the second mask layer to form fourth trench structures 520*a* and second capacitor contact structures 520, please refer to FIG. 23.

It should be understood that, although the various steps in the flow chart of FIG. 1 are displayed in sequence as indicated by the arrows, these steps are not necessarily executed in sequence according to a sequence indicated by the arrows. Unless specifically stated herein, the execution of these steps is not strictly restricted in order, and these steps can be executed in other orders. Moreover, at least a part of the steps in FIG. 1 may include multiple steps or multiple stages. These steps or stages are not necessarily executed at the same moment, but can be executed at different moments. The steps or stages are not necessarily executed sequentially, but may be executed in turn with or alternately with other steps or at least a part of steps or stages of other steps.

Continuously referring to FIG. 23, the present disclosure further provides a semiconductor structure, which includes a substrate 100, first trench structures 100*a*, bit line contact structures 200, bit line structures 300, bit line protection structures 400 and capacitor contact assemblies 500.

The substrate 100 includes active regions 110 and isolation regions 120. The first trench structures 100*a* are positioned in the substrate and pass through the active regions 110 and the isolation regions 120.

The bit line contact structure 200 is positioned in the first trench structure 100*a*, and an upper surface of the bit line contact structure is lower than an upper surface of the substrate 100. The bit line structure 300 is formed on the bit line contact structure 200, and at least a portion of the bit line structure 300 is positioned in the first trench structure 100*a*, and fills up the first trench structure 100*a* together with the bit line contact structure 200. The bit line protection structure 400 is formed on the bit line structure 300, and at least covers a surface of the bit line structure 300, and a second trench structure 400*a* is provided between adjacent bit line protection structures 400. The bit line protection structure 400 is disposed corresponding to the bit line structure 300 and the bit line contact structure 200. A group of the bit line protection structure 400, the bit line structure 300 and the bit line contact structure 200 corresponding to each other defines a bit line.

The capacitor contact assembly 500 includes a first capacitor contact structure 510 and a second capacitor contact structure 520. The first capacitor contact structure 510 is positioned in the second trench structure 400*a* and the second capacitor contact structure 520 covers an upper surface and a part of a side wall of the first capacitor contact structure 510.

In the embodiment, at least part of the bit line structure 300 may be embedded into the substrate 100, so that a height of the bit line outside the first trench structure 100*a* is reduced, thereby effectively improving the overall structure stability of the bit line.

At the same time, the second trench structure 400*a* between the bit lines outside the first trench structures 100*a* is used for filling of the first capacitor contact structure 510. If its height is too high, a filling gap is easily formed in a process of filling the first capacitor contact structure 510, so that the resistance value of the capacitor contact structure is affected.

In the embodiment, at least part of the bit line structure 300 is embedded into the substrate 100, so that the height of the bit line outside the first trench structure 100*a* is reduced, and further the trench depth of the second trench structure 400*a* is also reduced, the height of the first capacitor contact structure 510 filled in the second trench structure 400*a* is thus reduced.

Thus, a filling gap also may be effectively prevented from being formed during the process of filling the first capacitor contact structure 510 in the embodiment, thereby improving the filling quality of the first capacitor contact structure 510 and further reducing the resistance value of the first capacitor contact structure 510.

In addition, in the embodiment, the second capacitor contact structure 520 of the capacitor contact assembly 500 covers the upper surface and part of the side wall of the first capacitor contact structure 510, so that contact area between the two is effectively increased. In such a manner, charge transfer between the capacitor structure and a source or drain electrode of the active region is favorably realized.

In one embodiment, the semiconductor structure further includes first side wall protection layers 900 covering side walls of the first trench structures 100*a*.

The first side wall protection layer 900 may effectively prevent the bit line structure 300 from penetrating into a shallow trench isolating structure in an isolation region 120.

In one embodiment, the bit line protection structure 400 include a first dielectric layer 410, a first insulating layer 420, a second insulating layer 430 and a third insulating layer 440. The first dielectric layer 410 covers the upper surface of the bit line structure 300. The first insulating layer 420 covers a surface of the first dielectric layer 410. The second insulating layer 430 covers a surface of the first insulating layer 420. The third insulating layer 440 covers a surface of the second insulating layer 430.

The first dielectric layer 410, the first insulating layer 420, the second insulating layer 430 and the third insulating layer 440 may effectively insulate, isolate and protect the bit line structure 300. The material of the first insulating layer 420 may be silicon nitride, the material of the second insulating layer 430 may be silicon oxide, and the material of the third insulating layer 440 may be silicon nitride. Different materials are combined to form a bit line protection structure 400, which may reduce parasitic capacitance while effectively insulating and isolating the bit line structure 300, thereby improving the properties of a semiconductor device.

In one embodiment, the first capacitor contact structure 510 includes a first polysilicon layer 511 and a second polysilicon layer 512. The first polysilicon layer 511 is positioned in the second trench structure 400a, an upper surface of the first polysilicon layer 511 is lower than the upper surface of the bit line protection structure 400. The second polysilicon layer 512 is positioned on the first polysilicon layer 511, and is spaced apart from the bit line protection structure 400.

The second capacitor contact structure 520 covers an upper surface and part of a side wall of the second polysilicon layer 512.

In the embodiment, the first capacitor contact structure 510 includes a first polysilicon layer 511 and a second polysilicon layer 512, and the second polysilicon layer 512 is spaced apart from the bit line protection structure 400, so that the second capacitor contact structure 520 may cover the upper surface and part of the side wall of the second polysilicon layer 512. In such a manner, the second capacitor contact structure 520 covers the upper surface and part of the side wall of the first capacitor contact structure 510. As a result, in the embodiment, the contact area between the second capacitor contact structure 520 and the first capacitor contact structure 510 may be effectively increased, so that contact resistance is reduced.

Regarding specific limitation on the semiconductor structure, reference may be made to limitation on a manufacturing method of a semiconductor structure above, which is not described again herein.

The technical features of the above embodiments may be combined freely. In order to describe briefly, the description is not made to all possible combinations of the technical features of the embodiments. However, combinations of these technical features should be considered as falling into the scope of the specification as long as there is no contradiction in the combinations.

The above embodiments only express several embodiments of the present disclosure, are described in in a relatively specific and detailed manner, but it cannot be therefore construed as a limitation to the scope of the present disclosure. It is to be noted that several variations and modifications may also be made by those skilled in the art without departing from the spirit of the present disclosure, which all fall within the protection scope of the present disclosure. Therefore, the protection scope of the present disclosure shall be subjected to the appended claims.

The invention claimed is:

1. A manufacturing method of a semiconductor structure, comprising:
   providing a substrate comprising active regions and isolation regions;
   forming first trench structures on the substrate, the first trench structure passing through the active region and the isolation region;
   forming bit line contact structures in the first trench structures, wherein an upper surface of the bit line contact structure is lower than an upper surface of the substrate;
   forming bit line structures on the bit line contact structures, wherein the first trench structure is filled up with the bit line contact structure and the bit line structure, and at least part of the bit line structure is positioned in the first trench structure;
   forming bit line protection structures on the bit line structures, wherein the bit line protection structure at least covers an upper surface of the bit line structure, and a second trench structure is provided between adjacent bit line protection structures; and
   forming capacitor contact assemblies each comprising a first capacitor contact structure positioned in the second trench structure and a second capacitor contact structure covering an upper surface and part of a side wall of the first capacitor contact structure; and, wherein
   forming the first trench structures on the substrate comprises:
   forming a stress buffer material layer, an etching blocking material layer and a first mask material layer in sequence on the substrate;
   patterning the first mask material layer to form a first mask layer; and
   etching part of the etching blocking material layer, part of the stress buffer material layer and part of the substrate by taking the first mask layer as a mask,
   wherein the rest of the etching blocking material layer constitutes an etching blocking layer, and the rest of the stress buffer material layer constitutes a stress buffer layer;
   after the first trench structures are formed and before the bit line contact structures are formed in the first trench structures, further comprising:
   removing the first mask layer; and
   forming first side wall protection layers which cover side walls of the first trench structures.

2. The method of claim 1, wherein
forming the first side wall protection layers comprises:
   forming a first side wall material layer which covers a surface of the etching blocking layer, and the side walls and bottoms of the first trench structures; and
   removing the first side wall material layer on the surface of the etching blocking layer and the first side wall material layer on the bottoms of the first trench structures through an etching process.

3. The method of claim 2, wherein
forming the bit line contact structures in the first trench structures comprises:
   forming a bit line contact material layer which fills up the first trench structures and covers the surface of the etching blocking layer; and
   removing the bit line contact material layer on the surface of the etching blocking layer and part of the bit line contact material layer in each of the first trench structures through an etching process.

4. The method of claim 3, wherein
forming the bit line structures on the bite line contact structures comprises:
   forming a metal blocking material layer which covers surfaces of the bit line contact structures and the surface of the etching blocking layer;
   forming a first metal electrically conductive material layer which covers a surface of the metal blocking material layer; and removing the metal blocking material layer and the first metal electrically conductive material layer above the etching blocking layer, the rest of the metal blocking material layer constituting metal blocking layers, and the rest of the first metal electrically conductive material layer constituting first metal electrically conductive layers, wherein the metal blocking layer and the first metal electrically conductive layer constitute the bit line structure.

5. The method of claim 4, wherein removing the metal blocking material layer and the first metal electrically conductive material layer above the etching blocking layer comprises:

removing the metal blocking material layer and the first metal electrically conductive material layer above the etching blocking layer through a chemical mechanical polishing process by taking the etching blocking layer as a stop layer.

6. The method of claim 5, wherein forming the bit line protection structures on the bite line contact structures comprises:

forming first dielectric layers which cover the upper surfaces of the bit line structures;

forming first insulating layers which cover surfaces of the first dielectric layers;

forming second insulating layers which cover surfaces of the first insulating layers; and forming third insulating layers which cover surfaces of the second insulating layers, wherein the first dielectric layer, the first insulating layer, the second insulating layer and the third insulating layer constitute the bit line protection structure.

7. The method of claim 6, wherein forming the first dielectric layers comprises:

forming a first dielectric material layer which covers the etching blocking layer and the bit line structures; and removing the first dielectric material layer above the etching blocking layer and the etching blocking layer through an etching process, the rest of the first dielectric material layer constituting first dielectric layers.

8. The method of claim 1, wherein forming the first capacitor contact structures comprises:

forming first polysilicon layers which each are positioned in the second trench structure, wherein an upper surface of the first polysilicon layer is lower than an upper surface of the bit line protection structure;

forming first sacrificial layers which each cover an upper surface and part of a side wall of the bit line protection structure;

forming second polysilicon layers, wherein the second polysilicon layer, the first polysilicon layer and the first sacrificial layer fill up the second trench structure, and an upper surface of the second polysilicon layer is flush with an upper surface of the first sacrificial layer; and removing the first sacrificial layers to form third trench structures, wherein the first polysilicon layers and the second polysilicon layers constitute the first capacitor contact structures.

9. The method of claim 8, wherein forming first polysilicon layers comprises:

forming a first polysilicon material layer, an upper surface of the first polysilicon material layer being higher than an upper surface of the bit line protection structure; and etching back the first polysilicon material layer, wherein the rest of the first polysilicon material layer constitutes the first polysilicon layers.

10. The method of claim 8, wherein forming the second polysilicon layers comprises:

forming a second polysilicon material layer, an upper surface of the second polysilicon material layer being higher than an upper surface of the first sacrificial layer; and removing the second polysilicon material layer above an insulating layer of the bit line protection structure through a chemical mechanical polishing process by taking the insulating layer as a stop layer, wherein the rest of the second polysilicon material layer constitutes the second polysilicon layers.

11. The method of claim 8, wherein forming the second capacitor contact structures comprises:

forming a second metal electrically conductive material layer which covers the first capacitor contact structures and upper surfaces of the bit line protection structures, and fills up the third trench structures; and removing part of the second metal electrically conductive material layer to form fourth trench structures, wherein the rest of the second metal electrically conductive material layer constitutes the second capacitor contact structures, the second capacitor contact structures are spaced apart from the fourth trench structures and the second capacitor contact structures correspond to the fourth trench structures.

* * * * *